US012633879B2

(12) United States Patent
Aoki et al.

(10) Patent No.: US 12,633,879 B2
(45) Date of Patent: May 19, 2026

(54) DOHERTY AMPLIFICATION DEVICE

(71) Applicant: 1FINITY Inc., Kawasaki (JP)

(72) Inventors: Toshiyuki Aoki, Mitaka (JP); Akihiko Komatsuzaki, Kawasaki (JP); Mitsuharu Hamano, Sendai (JP)

(73) Assignee: 1FINITY Inc., Kawasaki (JP)

( * ) Notice: Subject to any disclaimer, the term of this patent is extended or adjusted under 35 U.S.C. 154(b) by 491 days.

(21) Appl. No.: 18/351,079

(22) Filed: Jul. 12, 2023

(65) Prior Publication Data

US 2024/0120885 A1     Apr. 11, 2024

(30) Foreign Application Priority Data

Sep. 29, 2022     (JP) ................................. 2022-156949

(51) Int. Cl.
*H03F 1/02* (2006.01)
*H03F 1/32* (2006.01)
*H03F 1/56* (2006.01)
*H03F 3/24* (2006.01)

(52) U.S. Cl.
CPC ......... *H03F 1/0288* (2013.01); *H03F 1/3247* (2013.01); *H03F 1/3282* (2013.01); *H03F 1/56* (2013.01); *H03F 3/245* (2013.01); *H03F 2200/451* (2013.01)

(58) Field of Classification Search
None
See application file for complete search history.

(56) References Cited

U.S. PATENT DOCUMENTS

2022/0393648 A1     12/2022     Yamashita et al.
2022/0407468 A1     12/2022     Torii et al.
2023/0387861 A1*    11/2023     Maxim ................... H03F 3/213

FOREIGN PATENT DOCUMENTS

WO     WO-2019/087430 A1     5/2019
WO     WO-2021/192204 A1     9/2021
WO     WO-2021/220338 A1     11/2021

* cited by examiner

*Primary Examiner* — Andrea Lindgren Baltzell
*Assistant Examiner* — Malane Lieng
(74) *Attorney, Agent, or Firm* — ArentFox Schiff LLP

(57)     ABSTRACT

A Doherty amplification device includes a distributor to distribute, into first and second signals, an input signal after distortion-compensation, first and second amplifiers, a combiner to combine the amplified first and second signals, and an adjuster between the distributor and the first or second amplifiers and to include a first calculation circuit to obtain a first-characteristic indicating a relationship of a gain of an output signal with respect to reference-power of the input signal, based on the output signal and the input signal, a classification circuit to classify the first-characteristic into regions according to the reference-power, a second calculation circuit to obtain a statistical-value of the gain for each regions, and a determination circuit to set, in the adjuster, a phase-delay at which distortion to be generated in the output signal is minimized, based on the statistical-value, wherein the adjuster adjusts the phase-delay of the first or second signals.

8 Claims, 34 Drawing Sheets

FIG. 1

AM-AM (gain) CHARACTERISTICS
(BEFORE DISTRIBUTION COMPENSATION IS APPLIED)

AM-AM (gain) CHARACTERISTICS
(AFTER DISTRIBUTION COMPENSATION IS APPLIED)

AM-AM (gain) CHARACTERISTICS
(AFTER PHASE DELAY IS ADJUSTED)

PHASE vs REF POWER

DELAY AMOUNT vs REF POWER

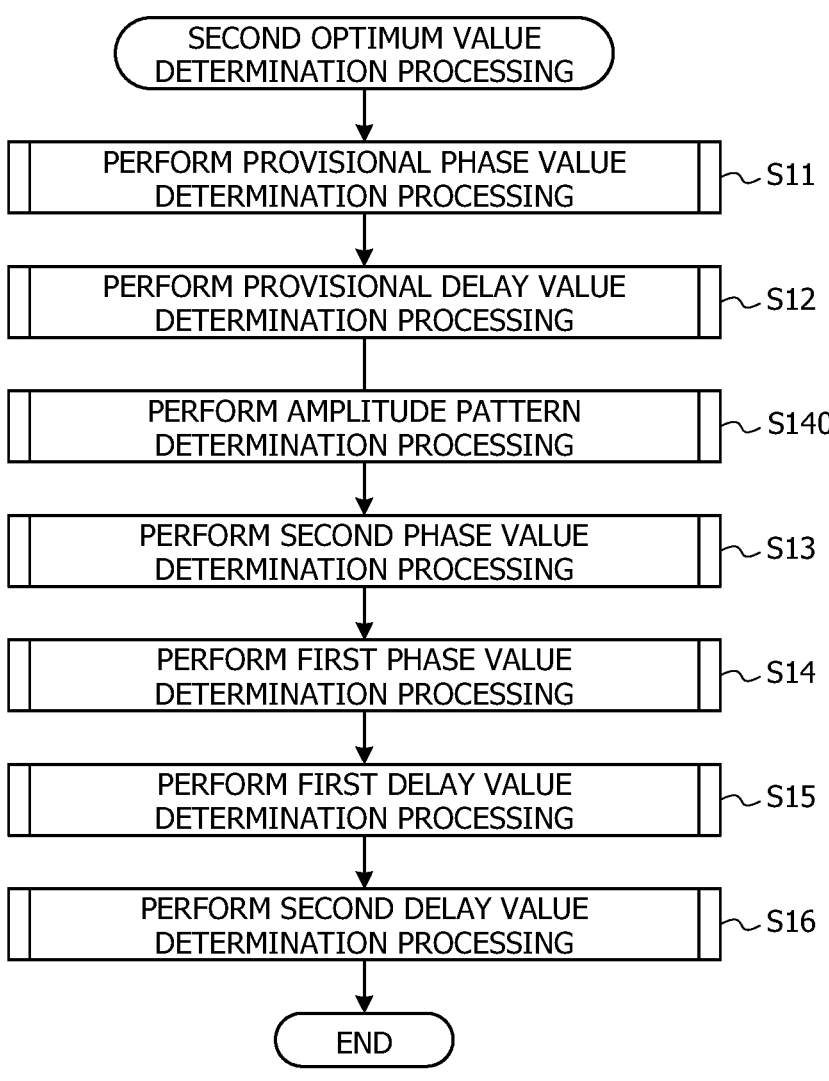

SECOND OPTIMUM VALUE
DETERMINATION PROCESSING

PERFORM PROVISIONAL PHASE VALUE
DETERMINATION PROCESSING        S11

PERFORM PROVISIONAL DELAY VALUE
DETERMINATION PROCESSING        S12

PERFORM AMPLITUDE PATTERN
DETERMINATION PROCESSING        S140

PERFORM SECOND PHASE VALUE
DETERMINATION PROCESSING        S13

PERFORM FIRST PHASE VALUE
DETERMINATION PROCESSING        S14

PERFORM FIRST DELAY VALUE
DETERMINATION PROCESSING        S15

PERFORM SECOND DELAY VALUE
DETERMINATION PROCESSING        S16

END

FIG. 23

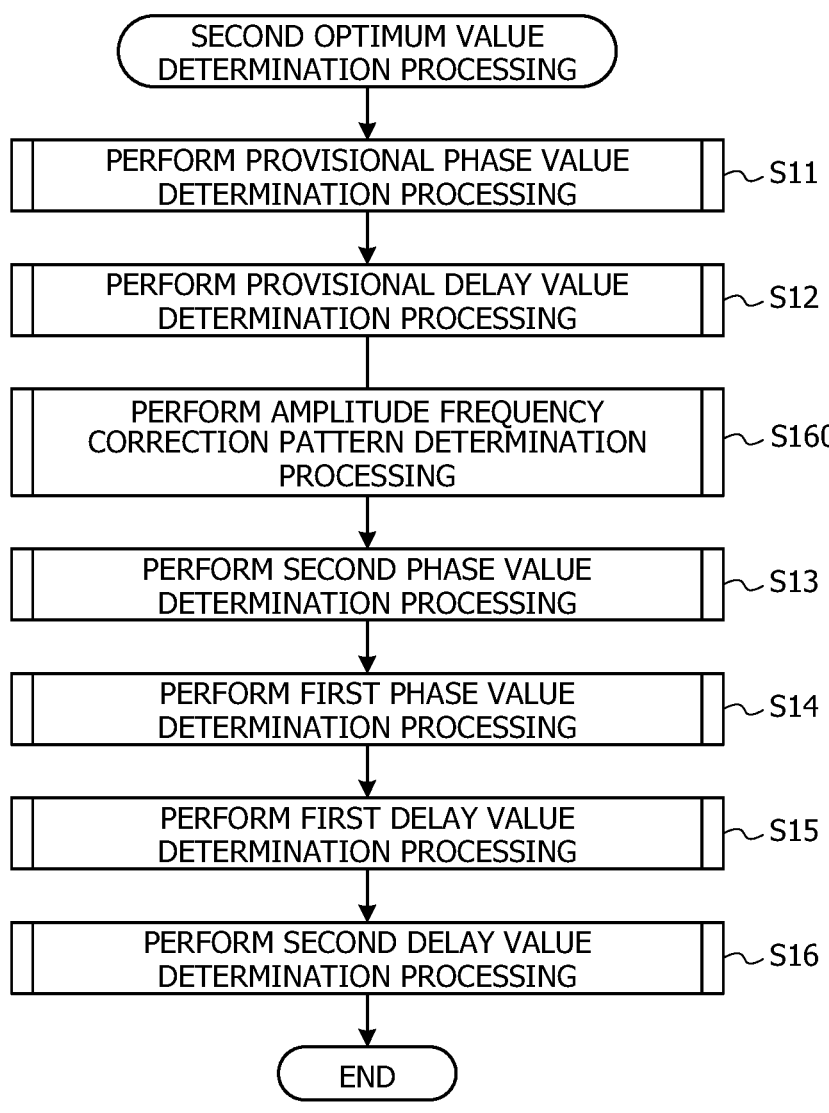

SECOND OPTIMUM VALUE
DETERMINATION PROCESSING

PERFORM PROVISIONAL PHASE VALUE
DETERMINATION PROCESSING — S11

PERFORM PROVISIONAL DELAY VALUE
DETERMINATION PROCESSING — S12

PERFORM AMPLITUDE FREQUENCY
CORRECTION PATTERN DETERMINATION
PROCESSING — S160

PERFORM SECOND PHASE VALUE
DETERMINATION PROCESSING — S13

PERFORM FIRST PHASE VALUE
DETERMINATION PROCESSING — S14

PERFORM FIRST DELAY VALUE
DETERMINATION PROCESSING — S15

PERFORM SECOND DELAY VALUE
DETERMINATION PROCESSING — S16

END

FIG. 30

DOHERTY AMPLIFICATION DEVICE

CROSS-REFERENCE TO RELATED APPLICATION

This application is based upon and claims the benefit of priority of the prior Japanese Patent Application No. 2022-156949, filed on Sep. 29, 2022, the entire contents of which are incorporated herein by reference.

FIELD

The embodiments discussed herein are related to a Doherty amplification device.

BACKGROUND

Conventionally, power amplifiers that amplify transmission power are used in various electronic devices including base stations of mobile communication systems. For example, in recent years, with an increase in speed of communication, it is expected to amplify the transmission power with higher efficiency from a viewpoint of suppressing power consumption and the like. It is known that the efficiency of an amplifier is the highest in an output saturation state (nonlinear state), and Doherty amplifiers are widely used as amplifiers corresponding to the state.

FIG. 28A is an explanatory diagram illustrating an example of an existing Doherty amplifier 100. The Doherty amplifier 100 illustrated in FIG. 28A includes a carrier amplifier (CA) 101 and a peak amplifier (PA) 102 coupled in parallel with the CA 101. Moreover, the Doherty amplifier 100 includes a first $\lambda/4$ line 103, a second $\lambda/4$ line 104, and a third $\lambda/4$ line 105. The CA 101 is a class AB bias amplifier that always operates. The PA 102 is a class C bias amplifier that is turned on only in a case where input power to the Doherty amplifier 100 is a predetermined value or more. The first $\lambda/4$ line 103 is a line that is coupled to an output stage of the CA 101 and converts an output-side impedance of the CA 101. The second $\lambda/4$ line 104 is a line that is coupled to an input stage of the PA 102 and compensates for a phase difference between the CA 101 and the PA 102 caused by the first $\lambda/4$ line 103 to be in phase. The third $\lambda/4$ line 105 is a matching circuit between the Doherty amplifier 100 and a load $Z_0$.

FIG. 28B is an explanatory diagram illustrating an example of an operation of the Doherty amplifier 100 in a case where the input power is less than the predetermined value. For example, in the case where the input power is less than the predetermined value, the CA 101 is in an ON state, and the PA 102 is in an OFF state due to a class C bias. Therefore, an output impedance when the PA 102 side is viewed from a combining point with the CA 101 is ideally open. A load impedance viewed from an output end of the CA 101 is $2Z_0$ by the first $\lambda/4$ line 103 that operates as an impedance conversion circuit because the load of $Z_0/2$ is viewed via the first $\lambda/4$ line 103 of the impedance $Z_0$. The CA 101 is designed to operate in a highly efficient manner although saturation power decreases in the case where the load impedance is $2Z_0$.

FIG. 28C is an explanatory diagram illustrating an example of the operation of the Doherty amplifier 100 in the case where the input power is the predetermined value or more. For example, in the case where the input power is the predetermined value or more, both the CA 101 and the PA 102 are in the ON state. In the CA 101 and the PA 102, the load impedance viewed by the CA 101 and the PA 102 in the state where the output load $Z_0/2$ is coupled is $Z_0$. Since the impedance of the first $\lambda/4$ line 103 in the output stage of the CA 101 is $Z_0$, impedance conversion is not performed, and the load impedance viewed from the output terminal of the CA 101 is also $Z_0$. In the case where the load impedance viewed from the output terminal of the CA 101 is $Z_0$, the CA 101 and the PA 102 are designed to have large saturation power, and thus the Doherty amplifier 100 outputs desired saturation power.

However, the existing Doherty amplifier 100 is highly efficient but linearity of the Doherty amplifier 100 is not good because gain and phase of output power change with respect to the input power. Therefore, digital predistortion (DPD) is known as a technique for compensating for linearity. FIG. 29 is an explanatory diagram illustrating an example of an existing Doherty amplification device 150. The Doherty amplification device 150 illustrated in FIG. 29 includes a Doherty amplification unit 151, a DPD 152 arranged in a preceding stage of the Doherty amplification unit 151, a digital analog converter (DAC) 153, a driver amplifier 154, and an analog digital converter (ADC) 155.

The Doherty amplification unit 151 includes a CA 161, a PA 162, a first $\lambda/4$ line 163, a second $\lambda/4$ line 164, and a third $\lambda/4$ line 165. The CA 161 is a class AB bias amplifier that always operates. The PA 162 is a class C bias amplifier that is turned on only in a case where the input power is a predetermined value or more. The first $\lambda/4$ line 163 is a line that is coupled to an output stage of the CA 161 and converts the output-side impedance of the CA 161. The second $\lambda/4$ line 164 is a line that is coupled to the input stage of the PA 162 and compensates for the phase difference between the CA 161 and the PA 162 caused by the first $\lambda/4$ line 163. The third $\lambda/4$ line 165 is a line that matches the impedance for combining outputs of the CA 161 and the PA 162 with the impedance in the subsequent stage.

In the case where the input power is less than the predetermined value, the load impedance viewed from an output end of the CA 161 is $2Z_0$ by the first $\lambda/4$ line 163 that operates as the impedance conversion circuit because the output load $Z_0/2$ is viewed via the first $\lambda/4$ line 163 of the impedance $Z_0$. In contrast, in the case where the input power is the predetermined value or more, for example, in the CA 161 and the PA 162, the load impedance viewed by the CA 161 and the PA 162 in the state where the output load $Z_0/2$ is coupled is $Z_0$. Since the impedance of the first $\lambda/4$ line 163 in the output stage of the CA 161 is $Z_0$, impedance conversion is not performed, and the load impedance viewed from the output terminal of the CA 161 is also $Z_0$. As a result, the Doherty amplification unit 151 combines a signal amplified by the CA 161 and a signal amplified by the PA 162 and outputs the combined signal.

The DPD 152 includes a first capture unit 152A, a second capture unit 152B, a calculation unit 152C, and a distortion compensation unit 152D. The first capture unit 152A extracts a part of an input signal as a reference (REF) signal. The second capture unit 152B extracts a part of an output signal from the output stage of the Doherty amplification unit 151 as a feedback (FB) signal. The calculation unit 152C calculates a distortion compensation coefficient such that there is no difference between the REF signal extracted by the first capture unit 152A and the FB signal extracted by the second capture unit 152B, and sets the calculated distortion compensation coefficient in the distortion compensation unit 152D. The distortion compensation unit 152D compensates for nonlinear distortion of the input signal such that there is no difference between the REF signal and the FB signal of the output stage of the Doherty amplification unit 151 based on the set distortion compensation coefficient. As a result, the linearity of the output signal in the output stage of the Doherty amplification unit 151 is secured.

In the DAC 153, the distortion compensation unit 152D in the DPD 152 performs analog conversion for the compensated input signal, and outputs the input signal after the analog conversion to the driver amplifier 154. The driver amplifier 154 amplifies the input signal to a specified level and outputs the amplified input signal to the Doherty amplification unit 151.

The ADC 155 digitally converts the FB signal that is a part of the output signal from the output stage of the Doherty amplification unit 151, and outputs the digitally converted FB signal to the second capture unit 152B.

The DPD 152 compensates for the input signal such that there is no difference between the REF signal and the FB signal of the output stage of the Doherty amplification unit 151. By repeating this processing, the linearity of the Doherty amplification unit 151 is improved.

However, in the Doherty amplification device 150 illustrated in FIG. 29, a phase difference, a delay difference, and an amplitude difference between paths of the CA 161 and the PA 162 are fixed by hardware design because there is one input. Therefore, a two-input Doherty amplification device is known in which the paths of the CA 161 and the PA 162 are divided into two inputs, and an adjustment unit that adjusts the phase difference, the delay difference, and the amplitude difference is arranged for each path. FIG. 30 is an explanatory diagram illustrating an example of a two-input Doherty amplification device 200.

The two-input Doherty amplification device 200 illustrated in FIG. 30 includes a DPD 210, a two-input Doherty amplification unit 220, and an ADC 230. The DPD 210 includes a first capture unit 211, a second capture unit 212, a calculation unit 213, and a distortion compensation unit 214. The first capture unit 211 extracts a part of the input signal as a REF signal. The second capture unit 212 extracts a part of the output signal from the output stage of the two-input Doherty amplification unit 220 as an FB signal. The calculation unit 213 calculates a distortion compensation coefficient such that there is no difference between the REF signal extracted by the first capture unit 211 and the FB signal extracted by the second capture unit 212, and sets the calculated distortion compensation coefficient in the distortion compensation unit 214. The distortion compensation unit 214 compensates for nonlinear distortion of the input signal such that there is no difference between the REF signal and the FB signal of the output stage of the two-input Doherty amplification unit 220 based on the set distortion compensation coefficient. As a result, the linearity of the output signal in the output stage of the two-input Doherty amplification unit 220 is secured.

The two-input Doherty amplification unit 220 includes a distribution unit 221, a first amplification unit 222 arranged in a first path in which a CA 222D is arranged, a second amplification unit 223 arranged in a second path in which a PA 223D is arranged, a combining unit 224, and an output λ/4 line 225.

The first amplification unit 222 includes a first adjustment unit 222A, a first DAC 222B, a first driver amplifier 222C, the CA 222D, and a λ/4 line 222E. The first adjustment unit 222A adjusts the phase difference, the delay difference, and the amplitude difference in the first path from the second path. The first DAC 222B performs analog conversion for the input signal compensated by the distortion compensation unit 214 in the DPD 210, and outputs the converted input signal to the first driver amplifier 222C. The first driver amplifier 222C amplifies the input signal to a specified level and outputs the amplified input signal to the CA 222D. The CA 222D is a class AB bias amplifier that always operates. The λ/4 line 222E is a line that is coupled to the output stage of the CA 222D and converts the output-side impedance of the CA 222D.

The second amplification unit 223 includes a second adjustment unit 223A, a second DAC 223B, a second driver amplifier 223C, and the PA 223D. The second adjustment unit 223A adjusts the phase difference, the delay difference, and the amplitude difference in the second path from the first path. The second DAC 223B performs analog conversion for the input signal compensated by the distortion compensation unit 214 in the DPD 210, and outputs the converted input signal to the second driver amplifier 223C. The second driver amplifier 223C amplifies the input signal to a specified level, and outputs the amplified input signal to the PA 223D. The PA 223D is a class C bias amplifier that is turned on only in the case where the input power is a predetermined value or more.

The combining unit 224 combines the input signals amplified by the CA 222D and the PA 223D. The output λ/4 line 225 is a line that matches the impedance of the combining unit 224 that combines the outputs of the CA 222D and the PA 223D with the impedance in a subsequent stage.

The first adjustment unit 222A adjusts the phase difference, the delay difference, and the amplitude difference in the first path from the second path. As a result, the phase difference, the delay difference, and the amplitude difference in the first path from the second path is adjusted. Furthermore, the second adjustment unit 223A adjusts the phase difference, the delay difference, and the amplitude difference in the second path from the first path. As a result, the phase difference, the delay difference, and the amplitude difference in the second path from the first path is adjusted.

In the two-input Doherty amplification device 200, the degree of freedom of adjusting the phase difference, the delay difference, and the amplitude difference between the paths using the adjustment unit for each path is increased, and improvement of amplification efficiency and distortion compensation performance, and improvement of a broadband are expected.

International Publication Pamphlet No. WO 2021/192204 and International Publication Pamphlet No. WO 2021/220338 are disclosed as related art.

SUMMARY

According to an aspect of the embodiments, a Doherty amplification device includes a distributor configured to distribute, into a first signal and a second signal, an input signal after distortion compensation from a distortion compensator that performs distortion compensation for the input signal, a first amplifier configured to amplify the first signal, a second amplifier configured to amplify the second signal, a combiner configured to combine the first signal from the first amplifier and the second signal from the second amplifier, and an adjuster arranged between the distributor and one of the first amplifier and the second amplifier and configured to include a first calculation circuit configured to obtain a first characteristic that indicates a relationship of a gain of an output signal with respect to reference power of the input signal, based on the output signal output from the combiner and the input signal input to the distortion compensator, a classification circuit configured to classify the obtained first characteristic into a plurality of regions according to a level of the reference power, a second calculation circuit configured to obtain a statistical value of the gain for each of the classified regions, and a determination circuit configured to set, in the adjuster, a phase delay value at which distortion to be generated in the output signal output from the combiner is minimized, based on the obtained statistical value for each of the regions, wherein the adjuster adjusts the phase delay value of one of the first signal and the second signal from the distributor.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is an explanatory diagram illustrating an example of a Doherty amplification device according to a first embodiment;

FIG. 16 is an explanatory diagram illustrating an example of an adjustment unit of the second embodiment;

FIG. 18 is a flowchart illustrating an example of a processing operation of a control unit in an adjustment unit related to second optimum value determination processing;

FIG. 23 is a flowchart illustrating an example of a processing operation of a control unit in an adjustment unit related to third optimum value determination processing;

Figure 30:
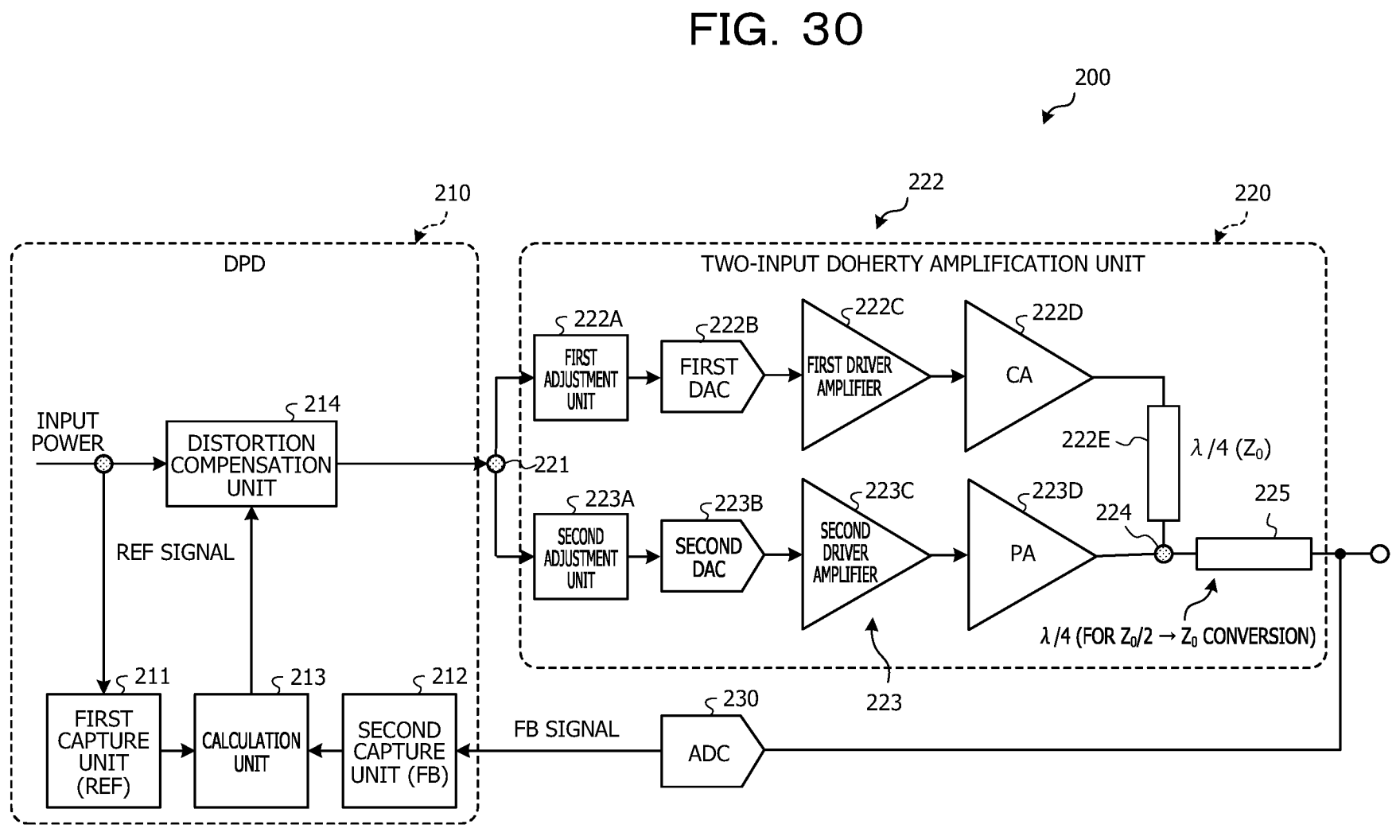

FIG. 30 is an explanatory diagram illustrating an example of a two-input Doherty amplification device.

DESCRIPTION OF EMBODIMENTS

Figure 2:
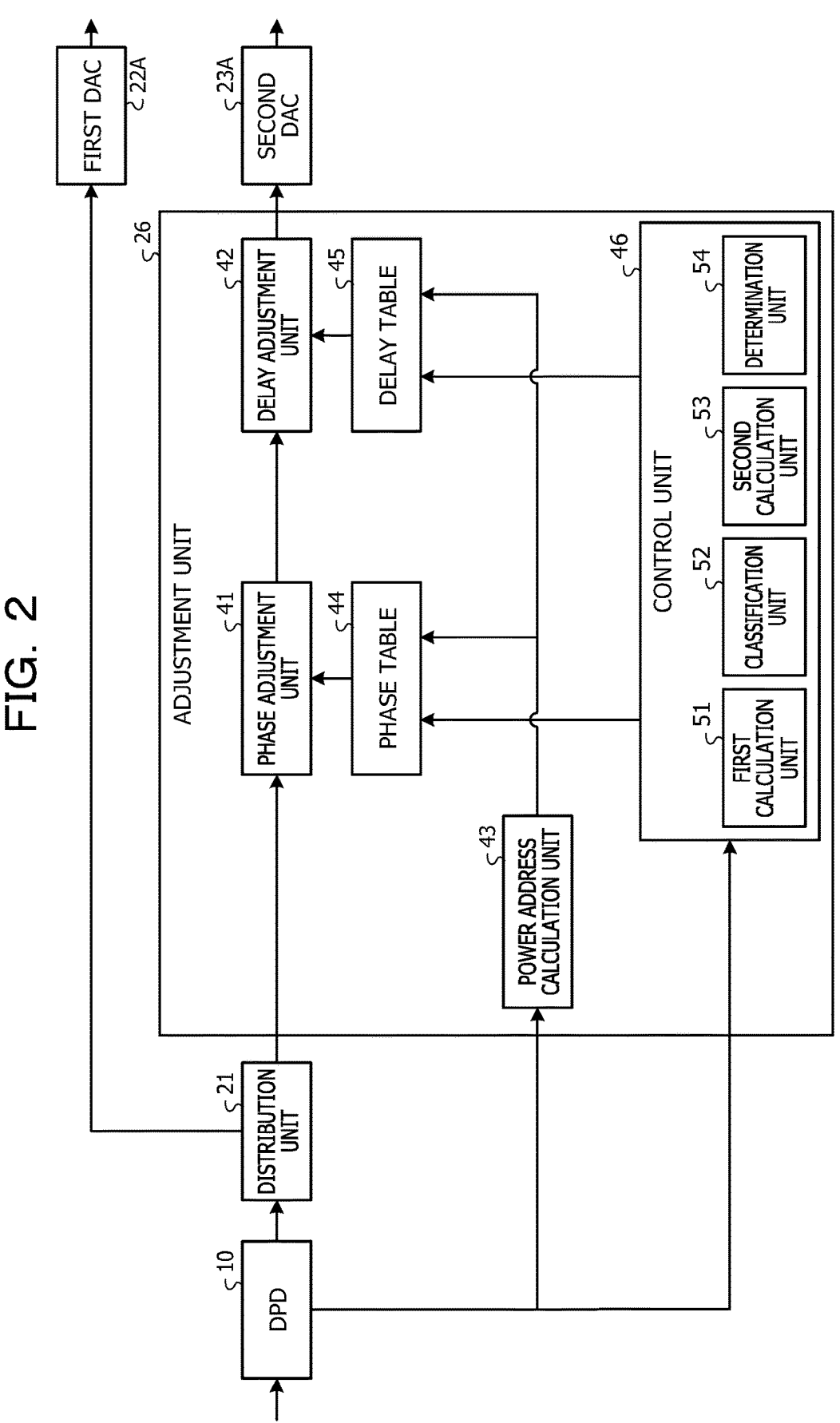
FIG. 2 is an explanatory diagram illustrating an example of an adjustment unit of the first embodiment.

In the two-input Doherty amplification device 200, it is necessary to adjust the adjustment unit for each path while confirming actual distortion by coupling a spectrum analyzer or the like, which is an external measurement device, for parameters of the adjustment units 222A and 223A for adjusting the phase difference and the delay difference between the paths. Therefore, it takes time to adjust the phase difference and the delay difference between the paths so as to obtain the best distortion characteristics.

Hereinafter, embodiments of Doherty amplification devices capable of significantly shortening the time to adjust the phase difference and the delay difference between the paths of the CA and the PA so as to obtain the best distortion characteristics will be described in detail with reference to the drawings. Note that the present embodiments do not limit the disclosed technique. Furthermore, each embodiment to be described below may be combined as appropriate unless otherwise contradicted.

First Embodiment

Figure 1:
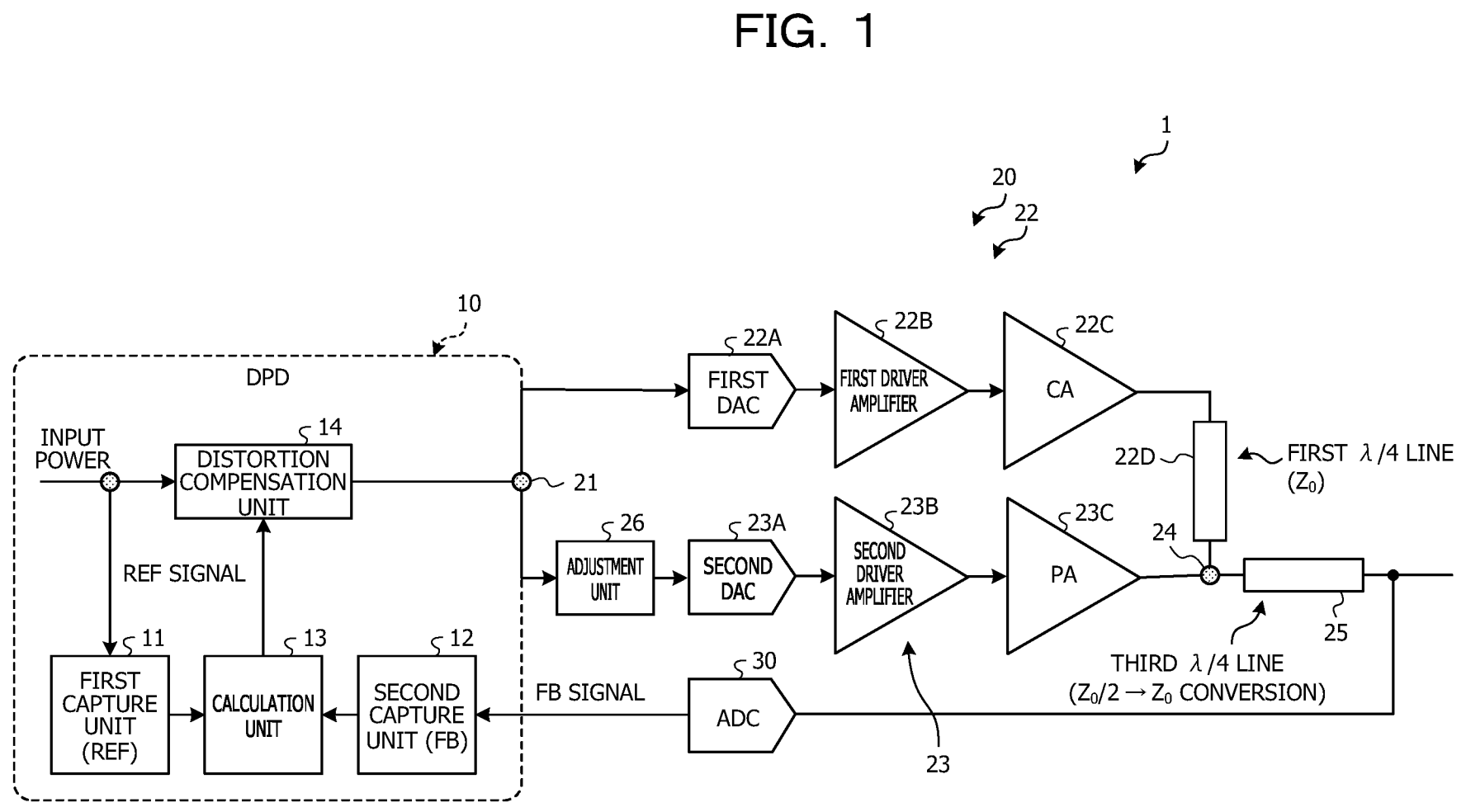

FIG. 1 is an explanatory diagram illustrating an example of a Doherty amplification device 1 according to a first embodiment. The Doherty amplification device 1 illustrated in FIG. 1 is a two-input Doherty amplification device. The Doherty amplification device 1 includes a digital predistortion (DPD) 10, a two-input Doherty amplification unit 20, and an analog digital convertor (ADC) 30. The DPD 10 compensates for nonlinear distortion of an input signal such that there is no difference between the input signal and an output signal from the two-input Doherty amplification unit 20. The two-input Doherty amplification unit 20 amplifies the input signal after distortion compensation in the DPD 10. The ADC 30 digitally converts a feedback (FB) signal that is a part of the output signal amplified in the two-input Doherty amplification unit 20.

The DPD 10 includes a first capture unit 11, a second capture unit 12, a calculation unit 13, and a distortion compensation unit 14. The first capture unit 11 extracts a part of the input signal as a reference (REF) signal. The second capture unit 12 extracts a part of the output signal from an output stage of the two-input Doherty amplification unit 20 as the FB signal. The calculation unit 13 calculates a distortion compensation coefficient such that there is no difference between the REF signal extracted by the first capture unit 11 and the FB signal extracted by the second capture unit 12, and sets the calculated distortion compensation coefficient in the distortion compensation unit 14. The distortion compensation unit 14 compensates for the nonlinear distortion of the input signal such that there is no difference between the REF signal and the FB signal based on the set distortion compensation coefficient.

The ADC 30 digitally converts the FB signal that is a part of the output signal from the output stage of the two-input Doherty amplification unit 20, and outputs the digitally converted FB signal to the second capture unit 12.

The two-input Doherty amplification unit 20 includes a distribution unit 21, a first amplification unit 22 arranged in a first path in which a carrier amplifier (CA) 22C is arranged, and a second amplification unit 23 arranged in a second path in which a peak amplifier (PA) 23C is arranged. Moreover, the two-input Doherty amplification unit 20 includes a combining unit 24, an output λ/4 line 25, and an adjustment unit 26.

The first amplification unit 22 includes a first DAC 22A, a first driver amplifier 22B, the CA 22C, and a λ/4 line 22D. The first DAC 22A performs analog conversion for a first signal that is the input signal compensated in the distortion compensation unit 14 in the DPD 10, and outputs the converted input signal to the first driver amplifier 22B. The first driver amplifier 22B amplifies the input signal to a specified level and outputs the amplified input signal to the CA 22C. The CA 22C is a class AB bias amplifier that always operates. The λ/4 line 22D is a line that is coupled to the output stage of the CA 22C and converts an output-side impedance of the CA 22C.

The second amplification unit 23 includes a second DAC 23A, a second driver amplifier 23B, and the PA 23C. The second DAC 23A performs analog conversion for a second signal that is the input signal compensated in the distortion compensation unit 14 in the DPD 10, and outputs the converted input signal to the second driver amplifier 23B. The second driver amplifier 23B amplifies the input signal to a specified level and outputs the amplified input signal to the PA 23C. The PA 23C is a class C bias amplifier that is turned on only in a case where input power is a predetermined value or more.

The combining unit 24 combines the input signals amplified in the CA 22C and the PA 23C. The output λ/4 line 25 is a line that matches an impedance of the combining unit 24 that combines the outputs of the CA 22C and the PA 23C with an impedance in a subsequent stage. The adjustment unit 26 automatically adjusts a phase difference and a delay difference in the second path from the first path.

FIG. 2 is an explanatory diagram illustrating an example of the adjustment unit 26 of the first embodiment. The adjustment unit 26 illustrated in FIG. 2 adjusts a phase value and a delay value of the second signal that passes through the second path according to reference power of the input signal in order to adjust the phase difference and the delay difference in the PA 23C of the second path from the CA 22C of the first path so that distortion characteristics become the best. For example, the adjustment unit 26 adjusts the delay value and the phase value of the PA 23C so as to maximize a gain near saturation power after Doherty combining of the combining unit 24 and eliminate variation in gain and phase. The adjustment unit 26 includes a phase adjustment unit 41, a delay adjustment unit 42 arranged in series with the phase adjustment unit 41, a power address calculation unit 43, a phase table 44, a delay table 45, and a control unit 46.

The phase adjustment unit 41 adjusts the phase value of the second signal that flows through the second path in which the PA 23C is arranged. The phase table 44 is a table that manages the phase value so as to maximize the gain near the saturation power after Doherty combining of the combining unit 24 and reduce the variation in gain and phase. The phase table 44 manages an optimum phase value of the phase adjustment unit 41 according to REF power in advance for each amplifier.

Figure 5A:
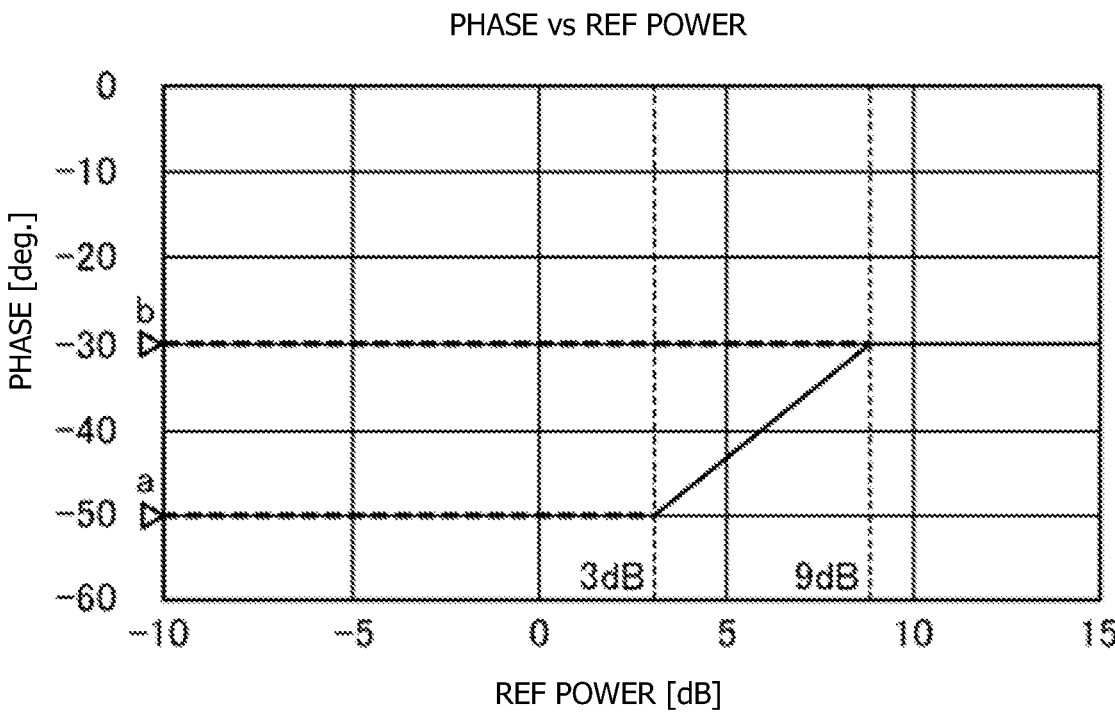
FIG. 5A is an explanatory graph illustrating an example of a phase table (phase value versus REF power)

FIG. 5A is an explanatory graph illustrating an example of the phase table 44 (phase value: REF power). A first phase value a in the phase table 44 illustrated in FIG. 5A is a phase value in a low-level REF power region, for example, in a power level region in which the PA 23C is in an OFF state. A second phase value b in the phase table 44 illustrated in FIG. 5A is a phase value in a high-level REF power region, for example, in a power level region in which the PA 23C is in an ON state. The first phase value a is −50 degrees, and the second phase value b is −30 degrees. Note that changing the phase value has an effect of improving distortion characteristics with respect to output power. Furthermore, the function of the phase table 44 changes according to the amplifier to be used.

The delay adjustment unit 42 adjusts the delay value of the second signal that flows through the second path in which the PA 23C is arranged. The delay table 45 is a table that manages the delay value with which a delay difference to the REF power of the second path in which the PA 23C is arranged from the first path in which the CA 22C becomes small. The delay table 45 manages an optimum delay value according to the REF power in advance for each amplifier.

Figure 5B:
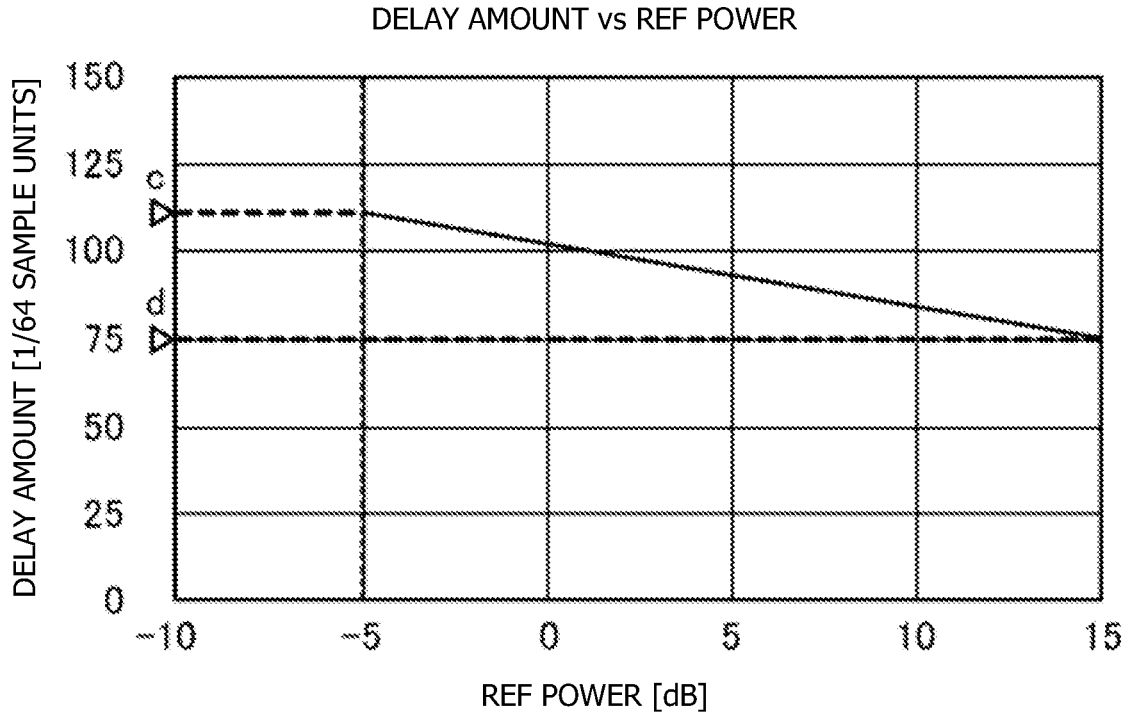
FIG. 5B is an explanatory graph illustrating an example of a delay table (delay value versus REF power)

FIG. 5B is an explanatory graph illustrating an example of the delay table 45 (delay value: REF power). A first delay value c in the delay table 45 illustrated in FIG. 5B is a delay value in the low-level REF power region, for example, in the power level region in which the PA 23C is in the OFF state. A second delay value d in the delay table 45 illustrated in FIG. 5B is a delay value in the high-level REF power region, for example, in the power level region in which the PA 23C is in the ON state. The first delay value c is 115, and the second delay value d is 75. Note that, for convenience of description, the delay value illustrated in FIG. 5B is expressed with a digital value (decimal number) uniquely associated with a delay time. Changing the delay value has an effect of improving distortion characteristics with respect to the output power. Furthermore, the function of the delay table 45 changes according to the amplifier to be used.

The power address calculation unit 43 calculates the REF power from the input signal from an input stage of the distortion compensation unit 14.

The control unit 46 includes a first calculation unit 51, a classification unit 52, a second calculation unit 53, and a determination unit 54. The first calculation unit 51 calculates amplitude modulation (AM)-AM (gain) characteristics using the REF signal and the FB signal obtained in the calculation unit 13 in the DPD 10 in a state where distortion compensation is not applied in the distortion compensation unit 14. The AM-AM (gain) characteristics are characteristics indicating a relationship of the gain of the output signal with respect to the reference power (REF power) of the input signal of the two-input Doherty amplification unit 20. The REF power of the AM-AM (gain) characteristics and the gain of the output signal are to be described by being normalized by the input power and the gain at the time of rated output transmission of the two-input Doherty amplification unit 20. The first calculation unit 51 calculates the gain of the AM-AM (gain) characteristics using (Equation 1).

$$\text{Gain} = \frac{|FB(I, Q)|}{|REF(I, Q)|} \tag{1}$$

$REF(I, Q), FB(I, Q)$ are complex data

Moreover, the first calculation unit 51 calculates REF power of the AM-AM (gain) characteristics using (Equation 2).

$$\text{REF power} = A \cdot |REF(I,Q)| \tag{2}$$

*A is a normalization constant

Figure 3A:
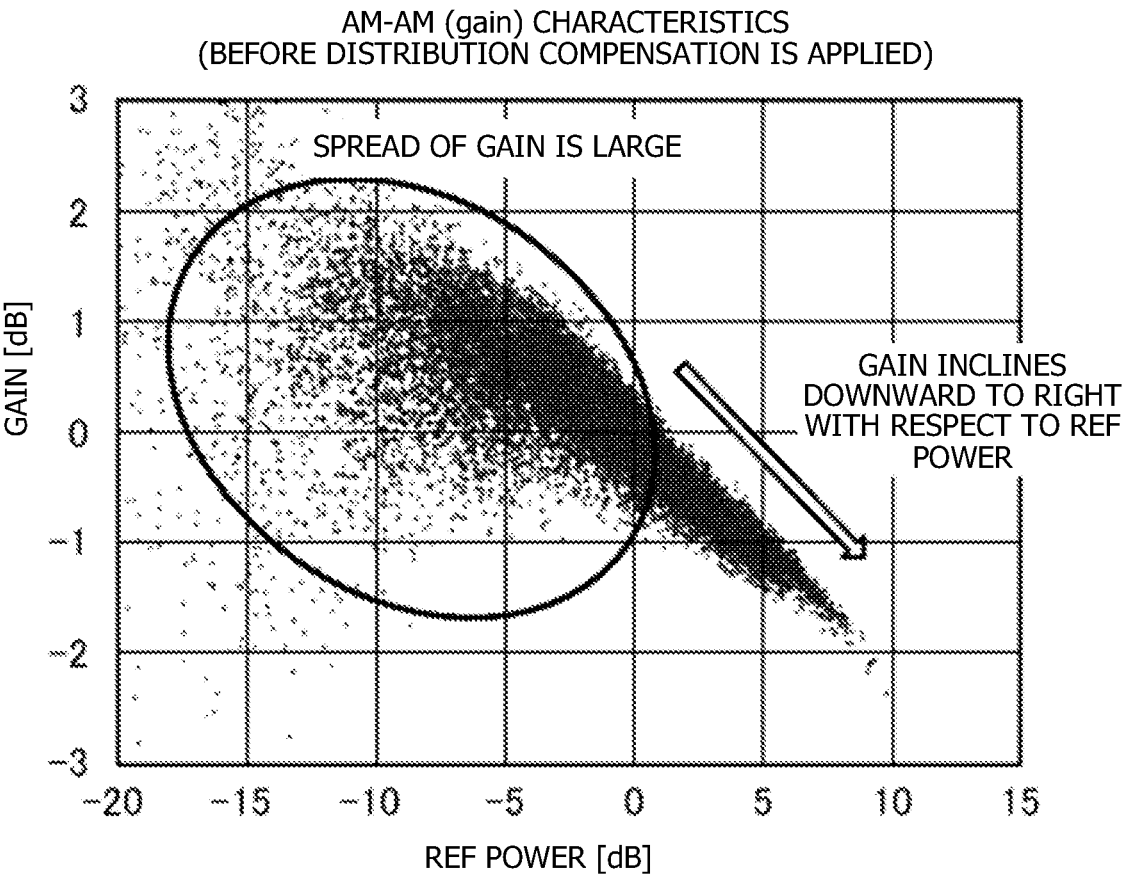
FIG. 3A is an explanatory graph illustrating an example of AM-AM (gain) characteristics before distortion compensation is applied in DPD.
Figure 3B:
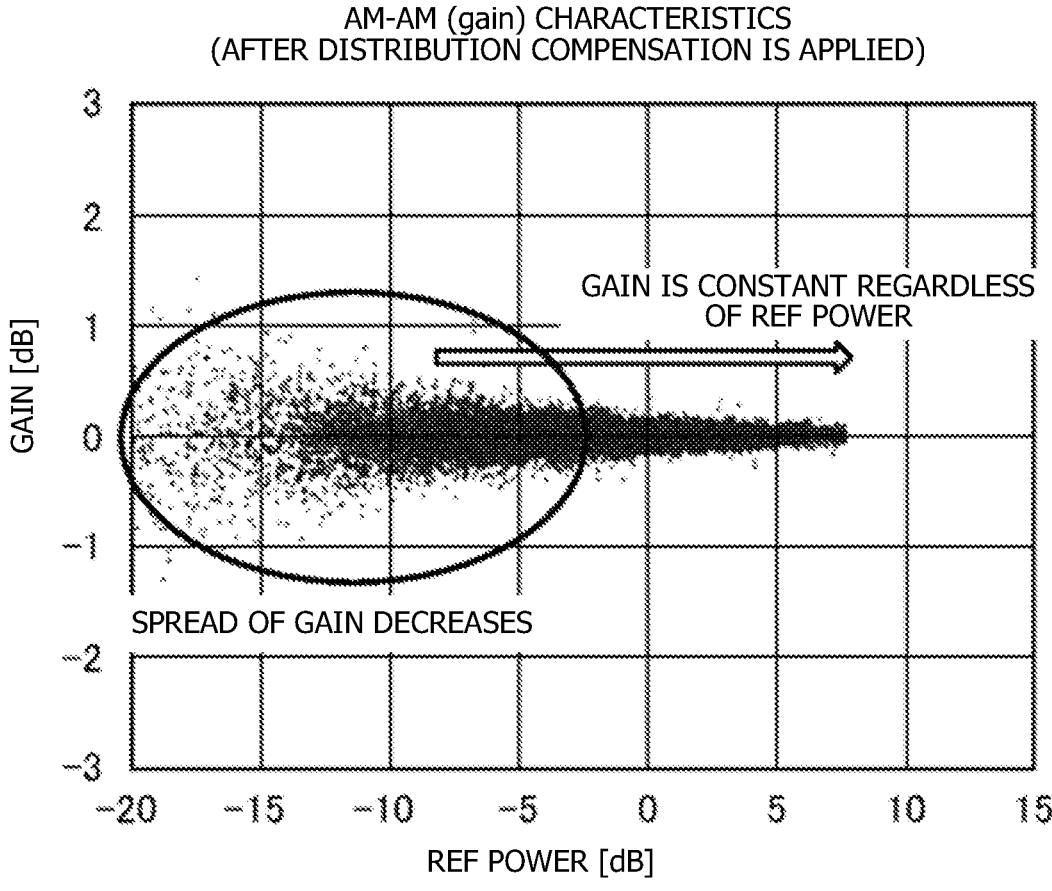
FIG. 3B is an explanatory graph illustrating an example of AM-AM (gain) characteristics after distortion compensation is applied in DPD.

For example, the AM-AM (gain) characteristics before and after distortion compensation is applied in a case where a modulated wave is input to the two-input Doherty amplification unit 20 with poor linearity will be described. FIG. 3A is an explanatory graph illustrating an example of the AM-AM (gain) characteristics before distortion compensation is applied in the DPD 10, and FIG. 3B is an explanatory graph illustrating an example of the AM-AM (gain) characteristics after distortion compensation is applied in the DPD 10. In the AM-AM (gain) characteristics illustrated in FIGS. 3A and 3B, the vertical axis represents the gain and the horizontal axis represents the REF power. Each dot is the gain with respect to the REF power.

In the AM-AM (gain) characteristics before distortion compensation is applied illustrated in FIG. 3A, the gain decreases as the REF power increases, and the variation in gain increases in a region where the REF power is low. In contrast, since the AM-AM (gain) characteristics after distortion compensation is applied illustrated in FIG. 3B is linear, the gain becomes constant with respect to the REF power, and the variation in gain is suppressed in the region where the REF power is low. For example, the linearity of the two-input Doherty amplification unit 20 is improved by executing distortion compensation of the DPD 10.

Figure 4A:
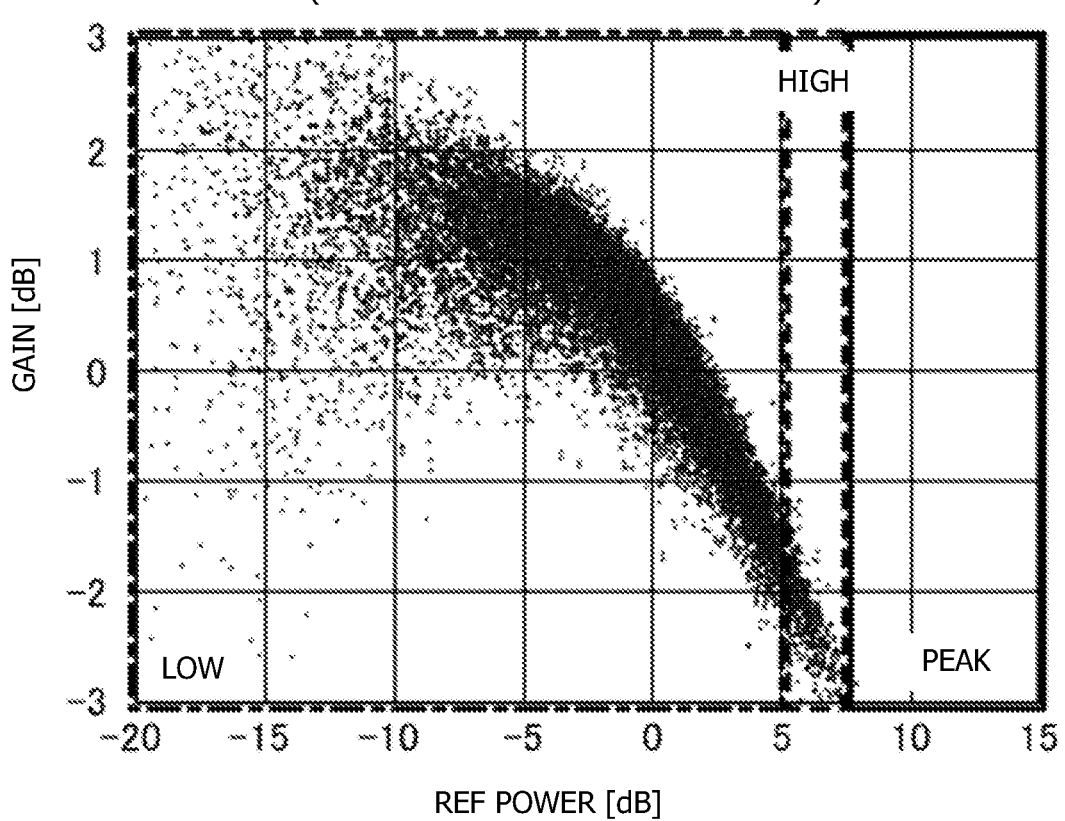
FIG. 4A is an explanatory graph illustrating an example of AM-AM (gain) characteristics before phase delay is adjusted in an adjustment unit.
Figure 4B:
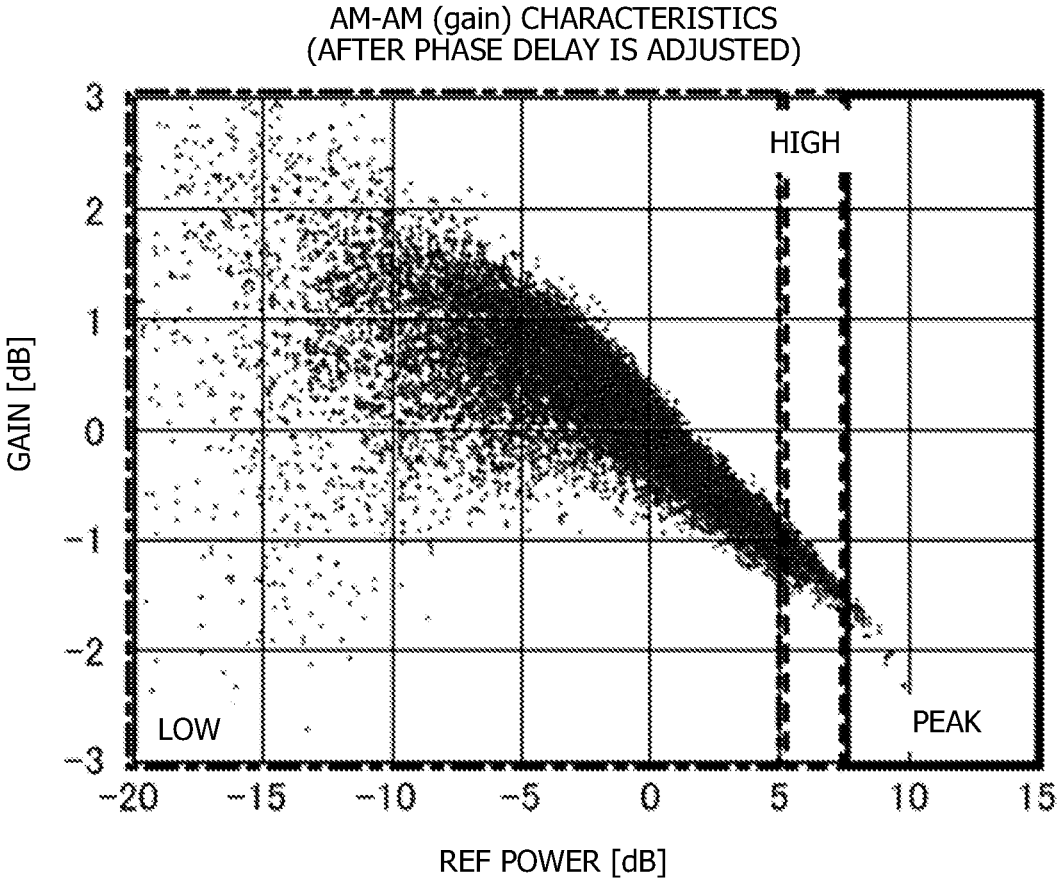
FIG. 4B is an explanatory graph illustrating an example of AM-AM (gain) characteristics after phase delay is adjusted in the adjustment unit.

Next, the AM-AM (gain) characteristics before and after phase delay is adjusted in the adjustment unit 26 will be described. FIG. 4A is an explanatory graph illustrating an example of AM-AM (gain) characteristics before phase delay is adjusted in the adjustment unit 26, and FIG. 4B is an explanatory graph illustrating an example of AM-AM (gain) characteristics after phase delay is adjusted in the adjustment unit 26. The AM-AM (gain) characteristics are classified into a Low region, a High region, and a Peak region according to a level of the REF power. Note that 0 dB of the REF power illustrated in FIGS. 4A and 4B is the REF power ($I^2+Q^2$) at the time of transmission of average transmission power of the device. The Low region is a level region of the REF power in which only the CA 22C in the two-input Doherty amplification unit 20 is in the ON state, for example, the PA 23C is in the OFF state, for example, a region of less than 5 dB. The Peak region is a level region of the REF power in which both the CA 22C and the PA 23C in the two-input Doherty amplification unit 20 are in the ON state, for example, a region of 7 dB or more, exclusive of 7 dB. The High region is a level region of the REF power when shifting from the Low region to the Peak region, for example, a region of 5 to 7 dB.

The classification unit 52 classifies the AM-AM characteristics (gain) before and after phase delay is adjusted into the Low region, the High region, and the Peak region according to the level of the REF power.

The second calculation unit 53 calculates a statistical value of each region in the AM-AM (gain) characteristics calculated with the input signal in the state where distortion compensation is not applied in the DPD 10. Then, the distortion compensation effect tends to increase in a case where the statistical value of each region satisfies a first condition or a second condition. Note that the first condition is a condition prioritized over the second condition.

The first condition is a state in which a gain decrease is small in a region where the REF power is high as illustrated in FIG. 3B, for example, in the Peak region. The first condition is, for example, a condition used when determining the phase value, a provisional phase value, and the delay value to be described below. In a case where the first condition is satisfied, it becomes a state in which the linearity is improved.

The second condition is a state in which the variation in gain is small in a region where the REF power is low as illustrated in FIG. 3B, for example, in the High region and the Low region. The second condition is, for example, a condition used when determining a provisional delay value to be described below. In a case where the second condition is satisfied, a memory effect of the amplifier is reduced.

The second calculation unit 53 calculates a statistical value for each region in the calculated AM-AM (gain) characteristics, for example, a gain average value Gain ave and a gain standard deviation value Gain std. The second calculation unit 53 calculates the gain average value Gain ave using (Equation 3).

$$\text{Gain\_ave} = \frac{1}{N}\sum_{i=0}^{N}\frac{|FB_i(I, Q)|}{|REF_i(I, Q)|} = \frac{1}{N}\sum_{i=0}^{N}\text{Gain}_i \tag{3}$$

Moreover, the second calculation unit 53 calculates the gain standard deviation value Gain std using (Equation 4).

$$Gain\_std = \tag{4}$$
$$\sqrt{\left\{\sigma\left(Re\left(\frac{FB_i(I, Q)}{REF_i(I, Q)}\right)\right)\right\}^2 + \left\{\sigma\left(Im\left(\frac{FB_i(I, Q)}{REF_i(I, Q)}\right)\right)\right\}^2}$$

Note that, in (Equation 4), (Equation 5) is used.

$$\sigma(X) = \sqrt{\frac{\sum_{i=0}^{N}(X - \mu)^2}{N}} \tag{5}$$

$\mu$: Average $N$: Number of samples

The second calculation unit 53 changes the phase value in the phase adjustment unit 41 as a parameter, and sequentially calculates the gain average values that are statistical values of respective region. For example, the determination unit 54 determines the provisional phase value based on the gain average value of the Peak region. The control unit 46 sets the determined provisional phase value in the phase adjustment unit 41.

Moreover, the second calculation unit 53 changes the delay value in the delay adjustment unit 42 as a parameter while keeping the provisional phase value set in the phase adjustment unit 41, and sequentially calculates the gain standard deviation values that are statistical values of respective region. The determination unit 54 determines the provisional delay value that satisfies the second condition, and becomes the smallest from the calculated gain standard deviation value in the High region, for example. The control unit 46 sets the determined provisional delay value in the delay adjustment unit 42.

The second calculation unit 53 changes the phase value in the phase adjustment unit 41 as a parameter while keeping the provisional delay value set in the delay adjustment unit 42, and sequentially calculates the gain average values that are statistical values of respective region. The determination unit 54 determines the optimum phase values (the first phase value a and the second phase value b) that satisfy the first condition, and become the largest from the calculated gain average value in the Peak region, for example, at which radio characteristics become the best from a correlation between distortion and the AM-AM (gain) characteristics, for example. The control unit 46 sets the determined optimum phase values (the first phase value and the second phase value) in the phase adjustment unit 41.

The second calculation unit 53 changes the delay value in the delay adjustment unit 42 as a parameter while keeping the optimum phase values set in the phase adjustment unit 41, and sequentially calculates the gain average values that are statistical values of respective region. For example, the determination unit 54 determines the optimum first delay value c that becomes the largest from the calculated gain average value in the High region. The control unit 46 sets the determined optimum first delay value c in the delay adjustment unit 42.

Moreover, the second calculation unit 53 changes the delay value in the delay adjustment unit 42 as a parameter while keeping the optimum phase values set in the phase adjustment unit 41, and sequentially calculates the gain average values that are statistical values of respective region. For example, the determination unit 54 determines the optimum second delay value d that satisfies the first condition, and becomes the largest from the calculated gain average value in the Peak region. The control unit 46 sets the determined optimum second delay value d in the delay adjustment unit 42.

It is confirmed that the gain decrease in the Peak region is reduced in the AM-AM (gain) characteristics after phase delay is adjusted illustrated in FIG. 4B as compared with the AM-AM (gain) characteristics before phase delay is adjusted illustrated in FIG. 4A. As a result, the distortion compensation effect tends to increase.

The first calculation unit 51 in the control unit 46 sets the phase value and the delay value determined in advance in the state where distortion compensation is not applied in the DPD 10, and then calculates the AM-AM (gain) characteristics. The determination unit 54 in the control unit 46 determines the optimum first phase value a, the optimum second phase value b, and the optimum first delay value c at which the largest gain average value in the Peak region is obtained, using the calculated AM-AM (gain) characteristics. Furthermore, the determination unit 54 determines the optimum second delay value d at which the largest gain average value in the High region is obtained, using the calculated AM-AM (gain) characteristics.

The control unit 46 determines the optimum first phase value a and the optimum second phase value b at which the largest gain average value in the Peak region is obtained, using the AM-AM (gain) characteristics calculated in the state where distortion compensation is not applied. Then, the control unit 46 stores and updates the optimum first phase value a and the optimum second phase value b as set parameters.

Furthermore, the control unit 46 determines the first delay value c at which the largest gain average value in the High region is obtained, using the AM-AM (gain) characteristics calculated in the state where distortion compensation is not applied. Moreover, the control unit 46 determines the second delay value d at which the largest gain average value in the Peak region is obtained, using the AM-AM (gain) characteristics calculated in the state where distortion compensation is not applied. Then, the control unit 46 stores and updates the optimum first delay value c and the optimum second delay value d as set parameters.

Figure 6:
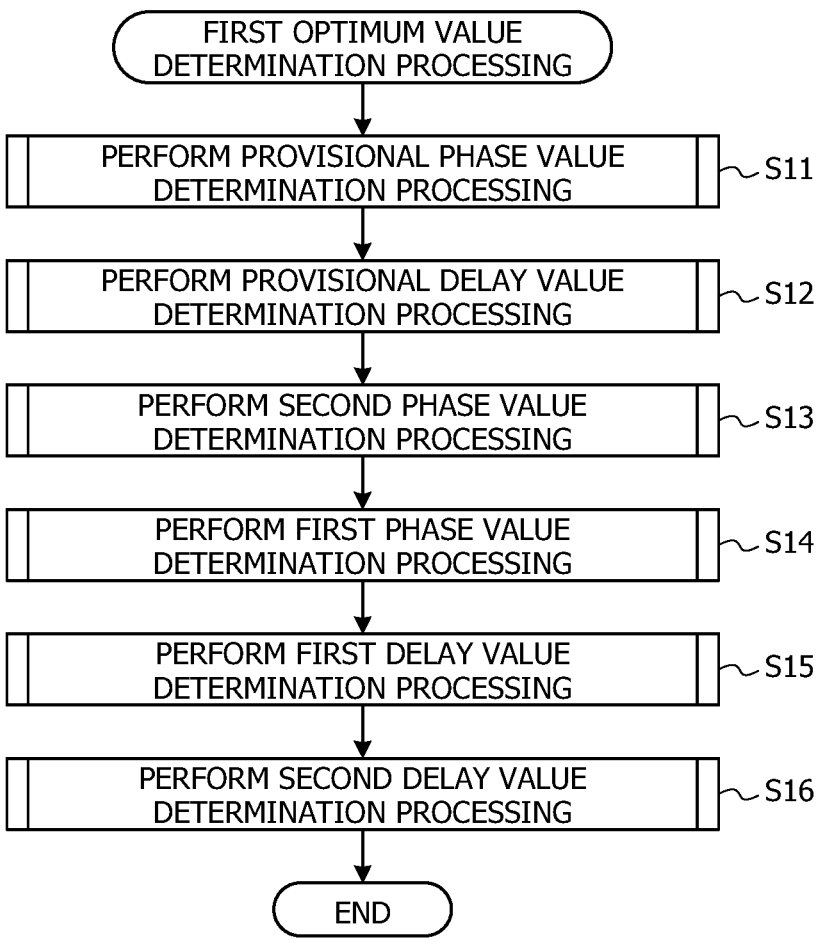
FIG. 6 is a flowchart illustrating an example of a processing operation of a control unit in an adjustment unit related to first optimum value determination processing.

Next, an operation of the Doherty amplification device 1 according to the first embodiment will be described. FIG. 6 is a flowchart illustrating an example of a processing operation of the control unit 46 in the adjustment unit 26 related to first optimum value determination processing. The first optimum value determination processing is, for example, processing of determining the optimum phase value and the optimum delay value of the two-input Doherty amplification unit 20 in the state where distortion compensation is not applied. Note that the first optimum value determination processing is, for example, processing executed at the time of product shipment.

Figure 7:
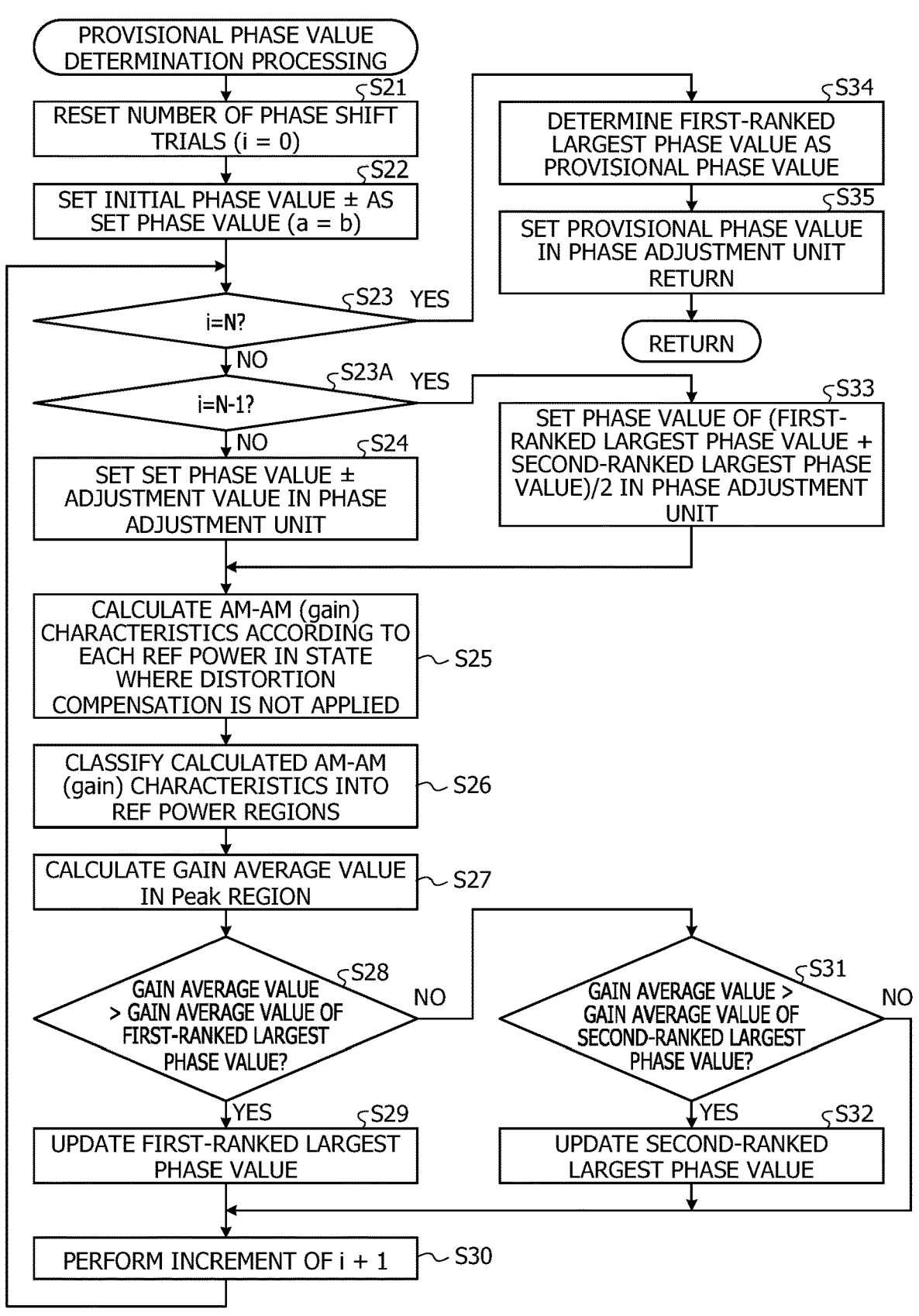
FIG. 7 is a flowchart illustrating an example of a processing operation of a control unit related to provisional phase value determination processing.

In FIG. 6, the control unit 46 executes provisional phase value determination processing illustrated in FIG. 7 for determining the provisional phase value that is a provisional phase value at which the gain average value in the Peak region of the AM-AM (gain) characteristics becomes the largest (operation S11). Note that the provisional phase value is a provisional first phase value and a provisional second phase value. After determining the provisional phase value, the control unit 46 executes provisional delay value determination processing illustrated in FIG. 8 for determining the provisional delay value that is a provisional delay value at which the gain standard deviation value in the High region of the AM-AM (gain) characteristics becomes the smallest (operation S12). Note that the provisional delay value is a provisional first delay value and a provisional second delay value.

Figure 9:
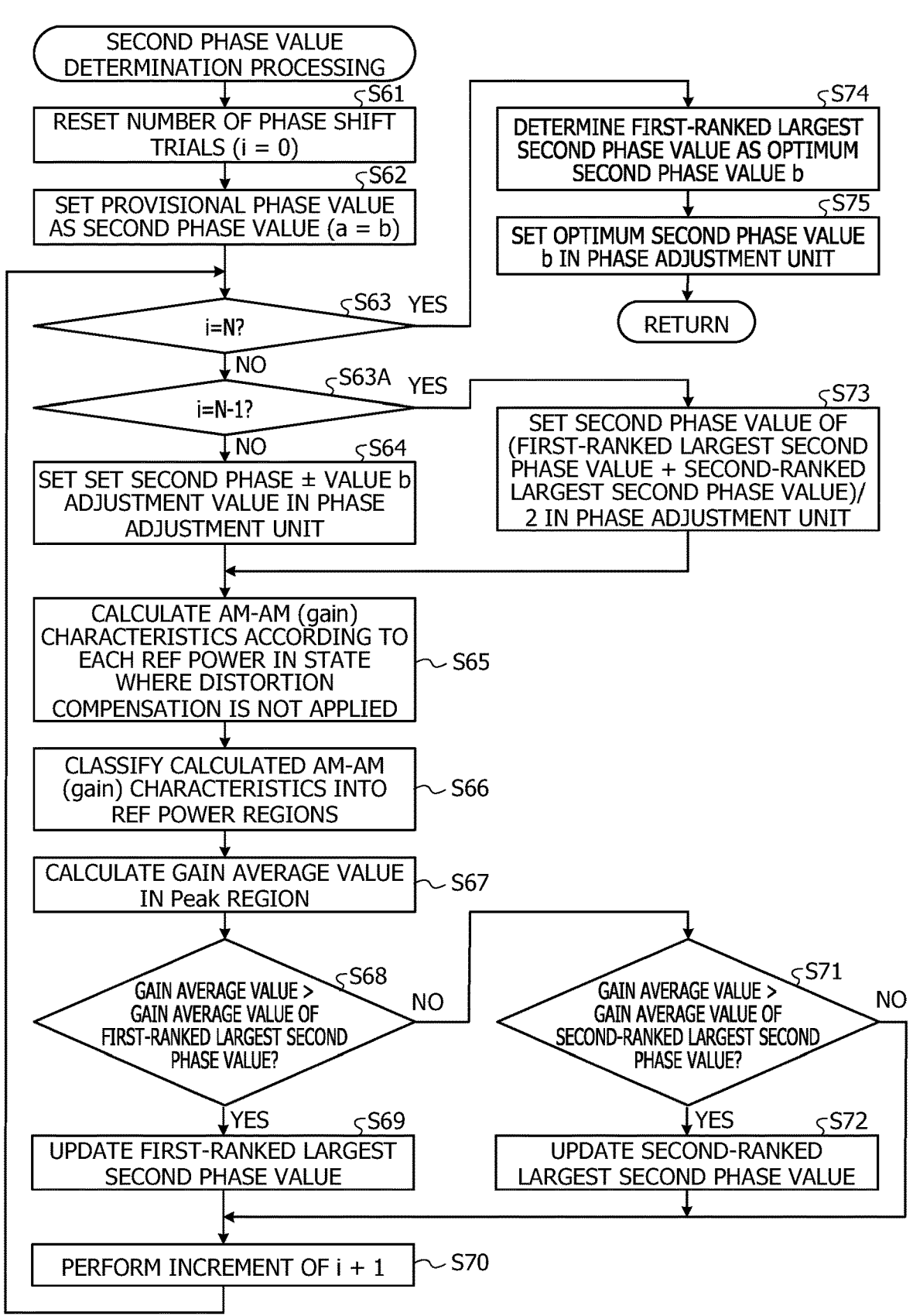
FIG. 9 is a flowchart illustrating an example of a processing operation of a control unit related to second phase value determination processing.

After determining the provisional delay value, the control unit 46 executes second phase value determination processing illustrated in FIG. 9 for determining the optimum second phase value b, which is a phase value at which the gain average value in the Peak region of the AM-AM (gain) characteristics becomes the largest (operation S13). Moreover, after determining the second phase value b, the control unit 46 executes first phase value determination processing illustrated in FIG. 11 for determining the optimum first phase value a, which is a phase value at which the gain average value in the Peak region of the AM-AM (gain) characteristics becomes the largest (operation S14).

Figure 12:
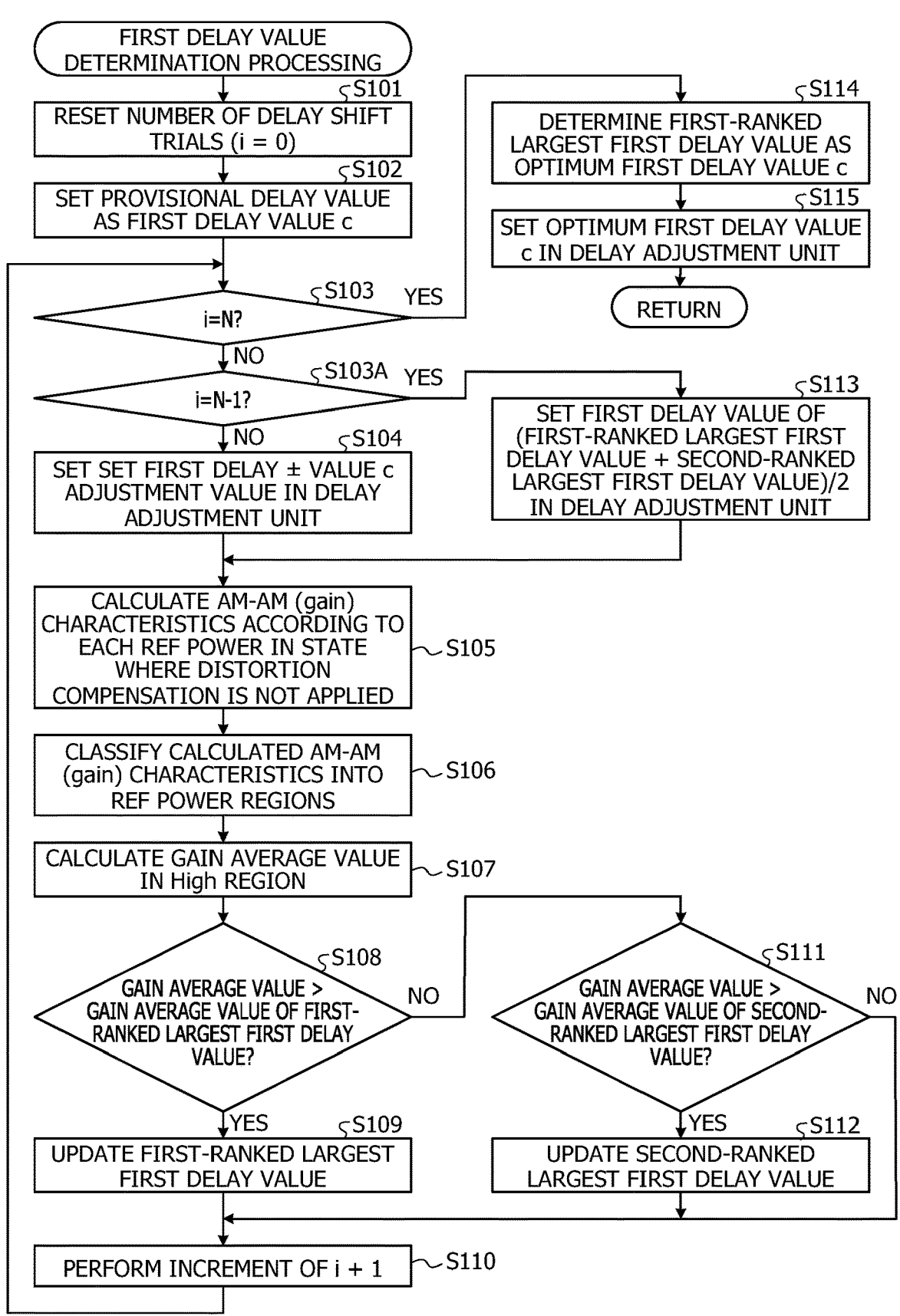
FIG. 12 is a flowchart illustrating an example of a processing operation of a control unit related to first delay value determination processing.

After determining the first phase value a, the control unit 46 executes first delay value determination processing illustrated in FIG. 12 for determining the optimum first delay value c, which is a delay value at which the gain average value in the High region of the AM-AM (gain) characteristics becomes the largest (operation S15). Moreover, after determining the first delay value c, the control unit 46 executes second delay value determination processing illustrated in FIG. 14 for determining the optimum second delay value d, which is a delay value at which the gain average value in the Peak region of the AM-AM (gain) characteristics becomes the largest (operation S16). Then, the processing operation illustrated in FIG. 6 is terminated.

FIG. 7 is a flowchart illustrating an example of a processing operation of the control unit 46 related to the provisional phase value determination processing. In FIG. 7, the control unit 46 sets the number of phase shift trials i to "0" (operation S21), and sets an initial phase value as a set phase value (a=b) with reference to the phase table 44 (operation S22). Note that, for convenience of description, the largest number of phase shift trials is N=3, but the number is not limited to 3 and may be changed as appropriate. The control unit 46 determines whether or not the set number of phase shift trials is i=N (operation S23).

In a case where the number of phase shift trials is not i=N (operation S23: No), the control unit 46 determines whether or not the number of phase shift trials is i=N−1 (operation S23A). In a case where the number of phase shift trials is not i=N−1 (operation S23A: No), the control unit 46 sets the set phase value obtained by adding the current set phase value±an adjustment value to the phase adjustment unit 41 in order to shift the phase (operation S24). Note that in a case where the number of phase shift trials is i=0, the adjustment value is set to 20°, for example, and in a case where the number of phase shift trials is i=1, the adjustment value is set to 10°, for example. For example, the optimum phase value is gradually narrowed by large phase shift of 20° in the case of i=0 and small phase shift of 10° in the case of i=1.

After setting the set phase value in the phase adjustment unit 41 in operation S24, the first calculation unit 51 in the control unit 46 calculates the AM-AM (gain) characteristics in the state where distortion compensation is not applied (operation S25). Note that the first calculation unit 51 calculates the AM-AM (gain) characteristics based on the FB signal and the REF signal in the state where distortion compensation is not applied by the DPD 10.

After calculating the AM-AM (gain) characteristics, the classification unit 52 in the control unit 46 classifies the calculated AM-AM (gain) characteristics into the Low region, the High region, and the Peak region according to the level of the REF power (operation S26). Moreover, the second calculation unit 53 in the control unit 46 calculates the gain average value in the Peak region from the AM-AM (gain) characteristics (operation S27).

The determination unit 54 in the control unit 46 determines whether or not the calculated gain average value in the Peak region exceeds the gain average value of the first-ranked largest phase value (operation S28). Note that the first-ranked largest phase value is a phase value at which the gain average value in the Peak region becomes the largest. In a case where the gain average value in the Peak region exceeds the gain average value of the first-ranked largest phase value (operation S28: Yes), the determination unit 54 executes update processing of updating the first-ranked largest phase value as a first-ranked set parameter (operation S29). The update processing updates the first-ranked largest phase value with the second-ranked largest phase value, updates the gain average value of the first-ranked largest phase value with the gain average value of the second-ranked largest phase value, updates the set value of the first-ranked largest phase value with the current set value, and stores the gain average value as the first-ranked largest gain average value. Note that the second-ranked largest phase value is a phase value at which the gain average value in the Peak region is in the second rank from the top.

After executing the update processing of updating the first-ranked largest phase value and the second-ranked largest phase value, the control unit 46 increments the number of phase shift trials by +1 (operation S30), and proceeds to operation S23 in order to determine whether or not the number of phase shift trials is i=N.

In a case where the gain average value in the Peak region does not exceed the gain average value of the first-ranked largest phase value (operation S28: No), the determination unit 54 determines whether or not the gain average value in the Peak region exceeds the gain average value of the second-ranked largest phase value (operation S31). In a case where the gain average value in the Peak region exceeds the gain average value of the second-ranked largest phase value (operation S31: Yes), the determination unit 54 executes update processing of updating the second-ranked largest phase value as a second-ranked set parameter (operation S32). The update processing of operation S32 updates the second-ranked largest phase value with the current set value, and stores the gain average value as the second-ranked largest gain average value. After executing the update processing of operation S32, the control unit 46 proceeds to the processing of operation S30 in order to increment the number of phase shift trials by +1. Furthermore, in a case where the gain average value in the Peak region has not exceeded the gain average value of the second-ranked largest phase value (operation S31: No), the determination unit 54 proceeds to the processing of operation S30 in order to increment the number of phase shift trials by +1.

In a case where the number of phase shift trials is i=N−1 (operation S23A: Yes), the determination unit 54 sets the phase value calculated by (the first-ranked largest phase value+the second-ranked largest phase value)/2 to the phase adjustment unit 41 (operation S33), and proceeds to the processing of operation S25. Note that, for example, the first-ranked largest phase value is 30°, the gain average value in the Peak region is −2 dB, the second-ranked largest phase value is 50°, the gain average value in the Peak region is −3 dB, the current set phase value is 40°, and the gain average value in the Peak region is −1.5 dB. In this case, the first-ranked largest phase value is 40°, and the second-ranked largest phase value is 30°. Then, the next set phase value is (40+30)/2, which is 35°.

In a case where the number of phase shift trials is i=N (operation S23: Yes), the determination unit 54 determines the first-ranked largest phase value as the provisional phase value (operation S34). Moreover, the determination unit 54 sets the provisional phase value in the phase adjustment unit 41 (operation S35) and terminates the processing operation illustrated in FIG. 7.

In the provisional phase value determination processing illustrated in FIG. 7, the provisional phase value is determined from the first-ranked largest phase value and the second-ranked largest phase value at which the gain average value in the Peak region is large.

Figure 8:
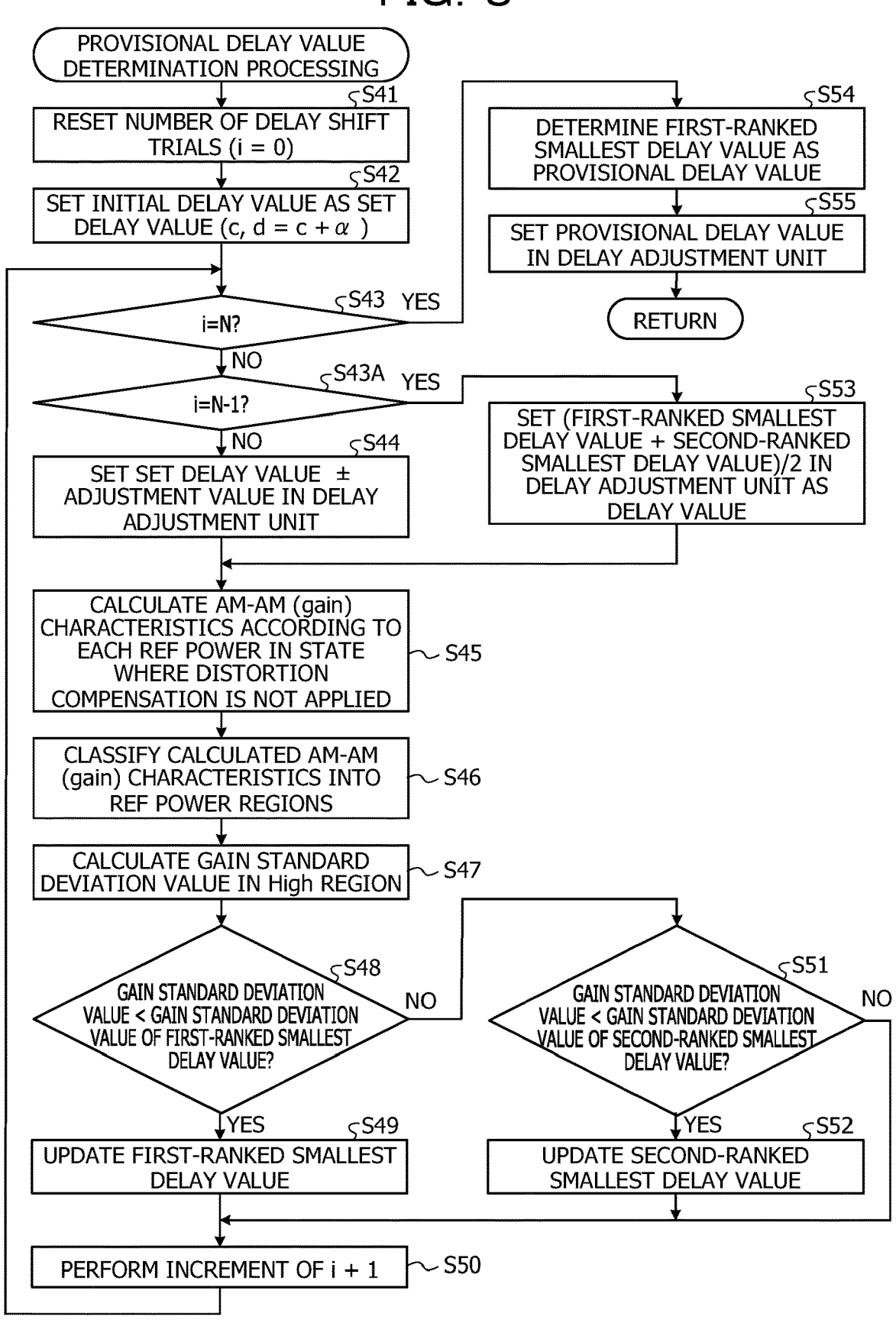
FIG. 8 is a flowchart illustrating an example of a processing operation of a control unit related to provisional delay value determination processing.

FIG. 8 is a flowchart illustrating an example of a processing operation of the control unit 46 related to the provisional delay value determination processing. In FIG. 8, the control unit 46 sets the number of delay shift trials i to "0" (operation S41), and sets an initial delay value as a set delay value (c, d=c+α) with reference to the delay table 45 (operation S42). Note that, for convenience of description, the largest number of delay shift trials is N=5, but the number is not limited to 5 and may be changed as appropriate. α is assumed to be 10. The control unit 46 determines whether or not the set number of delay shift trials is i=N (operation S43).

In a case where the number of delay shift trials is not i=N (operation S43: No), the control unit 46 determines whether or not the number of delay shift trials is i=N−1 (operation S43A). In a case where the number of delay shift trials is not i=N−1 (operation S43A: No), the control unit 46 sets the set delay value obtained by adding the current set delay value±an adjustment value to the delay adjustment unit 42 in order to shift the delay (operation S44). Note that in a case where the number of delay shift trials is i=0, for example, the adjustment value is assumed to be 32 and the set delay value is assumed to be ±32. In a case where the number of delay shift trials is i=1, for example, in a case where the first-ranked smallest delay value that is the current set delay value is 32, the set delay values c are assumed to be 64, 96, and 128, and in a case where the current set delay value is −32, the set delay values are assumed to be −128, −96, and −64. Moreover, in a case where the number of delay shift trials is i=2, the first-ranked smallest delay value that is the current set delay value and the adjustment value are assumed to be ±16, and in a case where the number of delay shift trials is i=3, the first-ranked smallest delay value that is the current set delay value and the adjustment value are assumed to be ±8. The delay adjustment unit 42 executes delay adjustment in 1/N sample units (N is an integer). One sample delay is a delay amount in units of sampling rate (fs) (1/fs). Note that, in a case where fs=122.88 MHz and N=64, the one sample delay is 1/122.88 MHz=8.14 n seconds, and the 1/N sample delay is 8.14 n seconds/64=0.13 n seconds.

After setting the set delay value in the delay adjustment unit 42 in operation S44, the first calculation unit 51 in the control unit 46 calculates the AM-AM (gain) characteristics in the state where distortion compensation is not applied (operation S45). Note that the first calculation unit 51 calculates the AM-AM (gain) characteristics based on the FB signal and the REF signal in the state where distortion compensation is not applied by the DPD 10.

After calculating the AM-AM (gain) characteristics, the classification unit 52 in the control unit 46 classifies the calculated AM-AM (gain) characteristics into the Low region, the High region, and the Peak region according to the level of the REF power (operation S46). Moreover, the second calculation unit 53 in the control unit 46 calculates the gain standard deviation value in the High region from the AM-AM (gain) characteristics (operation S47).

The determination unit 54 in the control unit 46 determines whether or not the calculated gain standard deviation value in the High region is smaller than the gain standard deviation value of the first-ranked smallest delay value (operation S48). Note that the first-ranked smallest delay value is a delay value at which the gain standard deviation value in the High region becomes the smallest. In a case where the calculated gain standard deviation value in the High region is smaller than the gain standard deviation value of the first-ranked smallest delay value (operation S48: Yes), the determination unit 54 executes update processing of updating the first-ranked smallest delay value as the first-ranked set parameter (operation S49). The update processing updates and stores the first-ranked smallest delay value with the second-ranked smallest delay value, the gain standard deviation value of the first-ranked smallest delay value with the gain standard deviation value of the second-ranked smallest delay value, the set value of the first-ranked smallest delay value with the current set value, and the gain standard deviation value with the first-ranked smallest gain standard deviation value. Note that the second-ranked smallest delay value is a delay value in which the gain standard deviation value in the High region is the second rank from the bottom.

After executing the update processing of updating the first-ranked smallest delay value and the second-ranked smallest delay value, the control unit 46 increments the number of delay shift trials by +1 (operation S50), and proceeds to operation S43 in order to determine whether or not the number of delay shift trials is i=N.

In a case where the gain standard deviation value in the High region is not smaller than the gain standard deviation value of the first-ranked smallest delay value (operation S48: No), the determination unit 54 determines whether or not the gain standard deviation value in the High region is smaller than the gain standard deviation value of the second-ranked smallest delay value (operation S51). In a case where the gain standard deviation value in the High region is smaller than the gain standard deviation value of the second-ranked smallest delay value (operation S51 Yes), the determination unit 54 executes update processing of updating the second-ranked smallest delay value as the second-ranked set parameter (operation S52). The update processing of operation S52 updates the second-ranked smallest delay value with the current set value, and stores the gain standard deviation value as the second-ranked smallest gain standard deviation value. After executing the update processing of operation S52, the control unit 46 proceeds to the processing of operation S50 in order to increment the number of delay shift trials by +1. Furthermore, in a case where the gain standard deviation value in the High region is not smaller than the gain standard deviation value of the second-ranked smallest delay value (operation S51: No), the determination unit 54 proceeds to the processing of operation S50 in order to increment the number of delay shift trials by +1.

In a case where the number of delay shift trials is i=N−1 (operation S43A: Yes), the determination unit 54 sets the delay value calculated by (the first-ranked smallest delay value+the second-ranked smallest delay value)/2 to the delay adjustment unit 42 (operation S53), and proceeds to the processing of operation S45.

In a case where the number of delay shift trials is i=N (operation S43: Yes), the determination unit 54 determines the first-ranked smallest delay value as the provisional delay value (operation S54). The determination unit 54 sets the provisional delay value in the delay adjustment unit 42 (operation S55) and terminates the processing operation illustrated in FIG. 8.

In the provisional delay value determination processing illustrated in FIG. 8, the provisional delay value is determined from the first-ranked smallest delay value and the second-ranked smallest delay value at which the gain standard deviation value in the High region is small.

FIG. 9 is a flowchart illustrating an example of a processing operation of the control unit 46 related to the second phase value determination processing. In FIG. 9, the control unit 46 sets the number of phase shift trials i to "0" (operation S61) and sets the provisional phase value as the second phase value b (operation S62). Note that, for convenience of description, the largest number of phase shift trials is N=3, but the number is not limited to 3 and may be changed as appropriate. The control unit 46 determines whether or not the set number of phase shift trials is i=N (operation S63).

In a case where the number of phase shift trials is not i=N (operation S63: No), the control unit 46 determines whether or not the number of phase shift trials is i=N−1 (operation S63A). In a case where the number of phase shift trials is not i=N−1 (operation S63A: No), the control unit 46 sets the second phase value b obtained by adding the current second phase value b±an adjustment value to the phase adjustment unit 41 in order to shift the phase (operation S64). Note that in a case where the number of phase shift trials is i=0, the adjustment value is set to 20°, for example, and in a case where the number of phase shift trials is i=1, the adjustment value is set to 10°, for example. For example, the optimum second phase value b is gradually narrowed by large phase shift of 20° in the case of i=0 and small phase shift of 10° in the case of i=1.

After setting the second phase value b in the phase adjustment unit 41 in operation S64, the first calculation unit 51 in the control unit 46 calculates the AM-AM (gain) characteristics in the state where distortion compensation is not applied (operation S65). Note that the first calculation unit 51 calculates the AM-AM (gain) characteristics based on the FB signal and the REF signal in the state where distortion compensation is not applied by the DPD 10.

After calculating the AM-AM (gain) characteristics, the classification unit 52 in the control unit 46 classifies the calculated AM-AM (gain) characteristics into the Low region, the High region, and the Peak region according to the level of the REF power (operation S66). Moreover, the second calculation unit 53 in the control unit 46 calculates the gain average value in the Peak region from the AM-AM (gain) characteristics (operation S67).

The determination unit 54 in the control unit 46 determines whether or not the calculated gain average value in the Peak region exceeds the gain average value of the first-ranked largest second phase value (operation S68). Note that the first-ranked largest second phase value is a second phase value at which the gain average value in the Peak region becomes the largest. In a case where the gain average value in the Peak region exceeds the gain average value of the first-ranked largest second phase value (operation S68: Yes), the determination unit 54 executes update processing of updating the first-ranked largest second phase value as the first-ranked set parameter (operation S69). The update processing updates the first-ranked largest second phase value with the second-ranked largest second phase value, the gain average value of the first-ranked largest second phase value with the gain average value of the second-ranked largest second phase value, the set value of the first-ranked largest second phase value with the current set value, and the gain average value with the first-ranked largest gain average value. Note that the second-ranked largest second phase value is a second phase value at which the gain average value in the Peak region is in the second rank from the top.

Figure 10:
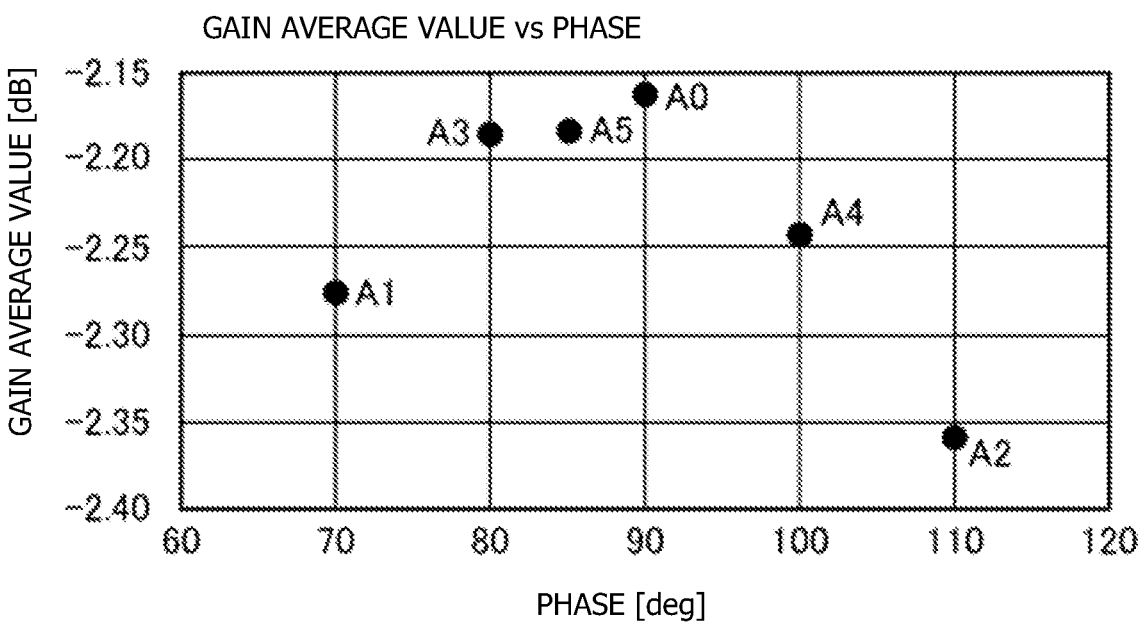
FIG. 10 is an explanatory graph illustrating an example of a method of determining a first-ranked largest second phase value and a second-ranked largest second phase value.

FIG. 10 is an explanatory graph illustrating an example of a method of determining a first-ranked largest second phase value and a second-ranked largest second phase value. The gain average value in the Peak region with the provisional phase value of 90° illustrated in FIG. 10 is assumed to be "A0". In a case of i=0, the gain average value in the Peak region with the second phase value of 70° is assumed to be "A1", and the gain average value in the Peak region with the second phase value of 110° is assumed to be "A2". As a result, when i=0, the first-ranked largest second phase value is 90° corresponding to the gain average value "A0" in the Peak region, and the second-ranked largest second phase value is 70° corresponding to the gain average value "A1" in the Peak region. Moreover, in a case of i=1, the gain average value in the Peak region with the second phase value of 80° is assumed to be "A3", and the gain average value in the Peak region with the second phase value of 100° is assumed to be "A4". As a result, when i=1, the first-ranked largest second phase value is 90° corresponding to the gain average value "A0" in the Peak region, and the second-ranked largest second phase value is 80° corresponding to the gain average value "A3" in the Peak region.

Then, after executing the update processing of updating the first-ranked largest second phase value and the second-ranked largest second phase value, the control unit 46 increments the number of phase shift trials by +1 (operation S70), and proceeds to operation S63 in order to determine whether or not the number of phase shift trials is i=N.

In a case where the gain average value in the Peak region does not exceed the gain average value of the first-ranked largest second phase value (operation S68: No), the determination unit 54 determines whether or not the gain average value in the Peak region exceeds the gain average value of the second-ranked largest second phase value (operation S71). In a case where the gain average value in the Peak region exceeds the gain average value of the second-ranked largest second phase value (operation S71: Yes), the determination unit 54 executes update processing of updating the second-ranked largest second phase value as the second-ranked set parameter (operation S72). The update processing of operation S72 updates the second-ranked largest second phase value with the current set value, and stores the gain average value as the second-ranked largest gain average value. After executing the update processing of operation S72, the control unit 46 proceeds to the processing of operation S70 in order to increment the number of phase shift trials by +1. Furthermore, in a case where the gain average value in the Peak region has not exceeded the gain average value of the second-ranked largest second phase value (operation S71: No), the determination unit 54 proceeds to the processing of operation S70 in order to increment the number of phase shift trials by +1.

In a case where the number of phase shift trials is i=N−1 (operation S63A: Yes), the control unit 46 sets the second phase value calculated by (the first-ranked largest second phase value+the second-ranked largest second phase value)/2 to the phase adjustment unit 41 (operation S73), and proceeds to the processing of operation S65. Note that, in the case of i=2, the second phase value b is (the first-ranked largest second phase value+the second-ranked largest second phase value)/2, for example, (90+80)/2=85° as illustrated in FIG. 10.

In a case where the number of phase shift trials is i=N (operation S63: Yes), the determination unit 54 determines the first-ranked largest second phase value as the optimum second phase value b (operation S74). For example, as illustrated in FIG. 10, the determination unit 54 determines, as the optimum second phase value b, the phase value of 90° at which the gain average value in the Peak region is the first-ranked largest.

Then, the determination unit 54 sets the optimum second phase value b in the phase adjustment unit 41 (operation S75) and terminates the processing operation illustrated in FIG. 9.

In the second phase value determination processing illustrated in FIG. 9, the optimum second phase value b is determined from the first-ranked largest second phase value and the second-ranked largest second phase value at which the gain average value in the Peak region is large.

Figure 11:
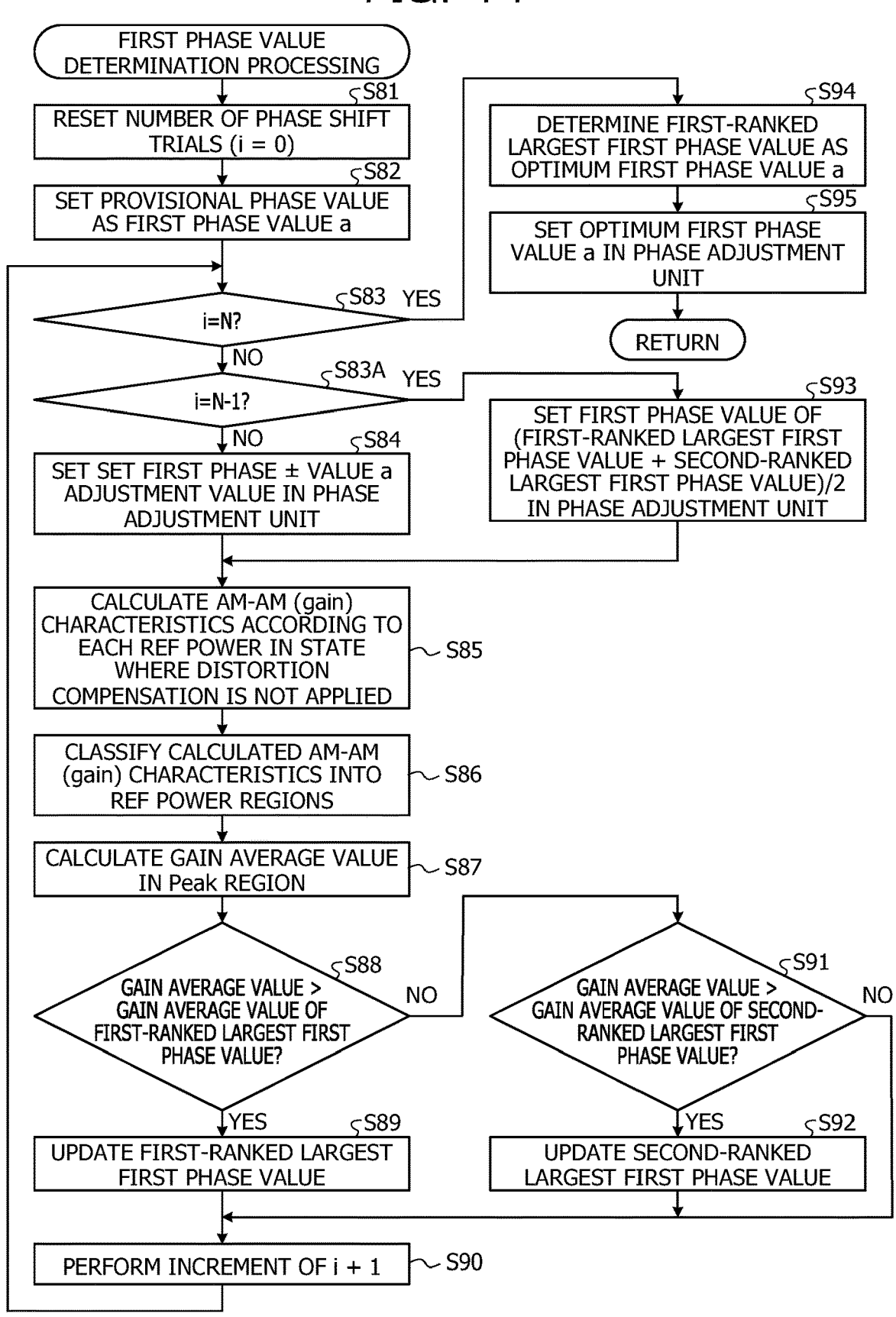
FIG. 11 is a flowchart illustrating an example of a processing operation of a control unit related to first phase value determination processing.

FIG. 11 is a flowchart illustrating an example of a processing operation of the control unit 46 related to the first phase value determination processing. In FIG. 11, the control unit 46 sets the number of phase shift trials i to "0" (operation S81) and sets the provisional phase value as the first phase value a (operation S82). Note that, for convenience of description, the largest number of phase shift trials is N=3, but the number is not limited to 3 and may be changed as appropriate. The control unit 46 determines whether or not the set number of phase shift trials is i=N (operation S83).

In a case where the number of phase shift trials is not i=N (operation S83: No), the control unit 46 determines whether or not the number of phase shift trials is i=N−1 (operation S83A). In a case where the number of phase shift trials is not i=N−1 (operation S83A: No), the control unit 46 sets the first phase value a obtained by adding the current first phase value a±an adjustment value to the phase adjustment unit 41 in order to shift the phase (operation S84). Note that in a case where the number of phase shift trials is i=0, the adjustment value is set to 20°, for example, and in a case where the number of phase shift trials is i=1, the adjustment value is set to 10°, for example. For example, the optimum first phase value a is gradually narrowed by large phase shift of 20° in the case of i=0 and small phase shift of 10° in the case of i=1.

After setting the first phase value a in the phase adjustment unit 41 in operation S84, the first calculation unit 51 in the control unit 46 calculates the AM-AM (gain) characteristics in the state where distortion compensation is not applied (operation S85). Note that the first calculation unit 51 calculates the AM-AM (gain) characteristics based on the FB signal and the REF signal in the state where distortion compensation is not applied by the DPD 10.

After calculating the AM-AM (gain) characteristics, the classification unit 52 in the control unit 46 classifies the calculated AM-AM (gain) characteristics into the Low region, the High region, and the Peak region according to the level of the REF power (operation S86). Moreover, the second calculation unit 53 in the control unit 46 calculates the gain average value in the Peak region from the AM-AM (gain) characteristics (operation S87).

The determination unit 54 in the control unit 46 determines whether or not the calculated gain average value in the Peak region exceeds the gain average value of the first-ranked largest first phase value (operation S88). Note that the first-ranked largest first phase value is a first phase value at which the gain average value in the Peak region becomes the largest. In a case where the gain average value in the Peak region exceeds the gain average value of the first-ranked largest first phase value (operation S88: Yes), the determination unit 54 executes update processing of updating the first-ranked largest first phase value as the first-ranked set parameter (operation S89). The update processing updates and stores the first-ranked largest first phase value with the second-ranked largest first phase value, the gain average value of the first-ranked largest first phase value with the gain average value of the second-ranked largest first phase value, the set value of the first-ranked largest first phase value with the current set value, and the gain average value with the first-ranked largest gain average value. Note that the second-ranked largest first phase value is a first phase value at which the gain average value in the Peak region is in the second rank from the top.

After executing the update processing of updating the first-ranked largest first phase value and the second-ranked largest first phase value, the control unit 46 increments the number of phase shift trials by +1 (operation S90), and proceeds to operation S83 in order to determine whether or not the number of phase shift trials is i=N.

In a case where the gain average value in the Peak region does not exceed the gain average value of the first-ranked largest first phase value (operation S88: No), the determination unit 54 determines whether or not the gain average value in the Peak region exceeds the gain average value of the second-ranked largest first phase value (operation S91). In a case where the gain average value in the Peak region exceeds the gain average value of the second-ranked largest first phase value (operation S91: Yes), the determination unit 54 executes update processing of updating the second-ranked largest first phase value as the second-ranked set parameter (operation S92). The update processing of operation S92 updates the second-ranked largest first phase value with the current set value, and stores the gain average value as the second-ranked largest gain average value. After executing the update processing of operation S92, the control unit 46 proceeds to the processing of operation S90 in order to increment the number of phase shift trials by +1. Furthermore, in a case where the gain average value in the Peak region has not exceeded the gain average value of the second-ranked largest first phase value (operation S91: No), the determination unit 54 proceeds to the processing of operation S90 in order to increment the number of phase shift trials by +1.

In a case where the number of phase shift trials is i=N−1 (operation S83A: Yes), the control unit 46 sets the first phase value calculated by (the first-ranked largest first phase value+the second-ranked largest first phase value)/2 to the phase adjustment unit 41 (operation S93), and proceeds to the processing of operation S85. Then, in a case where the number of phase shift trials is i=N (operation S83: Yes), the determination unit 54 determines the first-ranked largest first phase value as the optimum first phase value a (operation S94). Then, the determination unit 54 sets the optimum first phase value a in the phase adjustment unit 41 (operation S95) and terminates the processing operation illustrated in FIG. 11.

In the first phase value determination processing illustrated in FIG. 11, the optimum first phase value a is determined from the first-ranked largest first phase value and the second-ranked largest first phase value at which the gain average value in the Peak region is large.

FIG. 12 is a flowchart illustrating an example of a processing operation of the control unit 46 related to the first delay value determination processing. In FIG. 12, the control unit 46 sets the number of delay shift trials i to "0" (operation S101) and sets the provisional delay value as the first delay value c (operation S102). Note that, for convenience of description, the largest number of delay shift trials is N=5, but the number is not limited to 5 and may be changed as appropriate. $\alpha$ is assumed to be 10. The control unit 46 determines whether or not the set number of delay shift trials is i=N (operation S103).

In a case where the number of delay shift trials is not i=N (operation S103: No), the control unit 46 determines whether or not the number of delay shift trials is i=N−1 (operation S103A). In a case where the number of delay shift trials is not i=N−1 (operation S103A: No), the control unit 46 sets the first delay value c obtained by adding the current first delay value±an adjustment value to the delay adjustment unit 42 in order to shift the delay (operation S104). Note that in a case where the number of delay shift trials is i=0, for example, the adjustment value is assumed to be 32 and the set first delay value c is assumed to be ±32. In a case where the number of delay shift trials is i=1, for example, in a case where the first-ranked smallest delay value $c_1$ that is the current first delay value is 32, the set first delay values c are assumed to be 64, 96, and 128, and in a case where the current first delay value c is −32, the set first delay values are assumed to be −128, −96, and −64. Moreover, in a case where the number of delay shift trials is i=2, the first-ranked smallest first delay value $c_1$ that is the current set first delay value and the adjustment value are assumed to be ±16, and in a case where the number of delay shift trials is i=3, the first-ranked smallest first delay value $c_1$ that is the current set first delay value and the adjustment value are assumed to be ±8. The delay adjustment unit 42 executes delay adjustment in 1/N sample units (N is an integer). One sample delay is a delay amount in units of sampling rate (fs) (1/fs). Note that, in a case where fs=122.88 MHz and N=64, the one sample delay is 1/122.88 MHz=8.14 n seconds, and the 1/N sample delay is 8.14 n seconds/64=0.13 n seconds.

After setting the first delay value c in the delay adjustment unit 42 in operation S104, the first calculation unit 51 in the control unit 46 calculates the AM-AM (gain) characteristics in the state where distortion compensation is not applied (operation S105). Note that the first calculation unit 51 calculates the AM-AM (gain) characteristics based on the FB signal and the REF signal in the state where distortion compensation is not applied by the DPD 10.

After calculating the AM-AM (gain) characteristics, the classification unit 52 in the control unit 46 classifies the calculated AM-AM (gain) characteristics into the Low region, the High region, and the Peak region according to the level of the REF power (operation S106). Moreover, the second calculation unit 53 in the control unit 46 calculates the gain average value in the High region from the AM-AM (gain) characteristics (operation S107).

Figure 13:
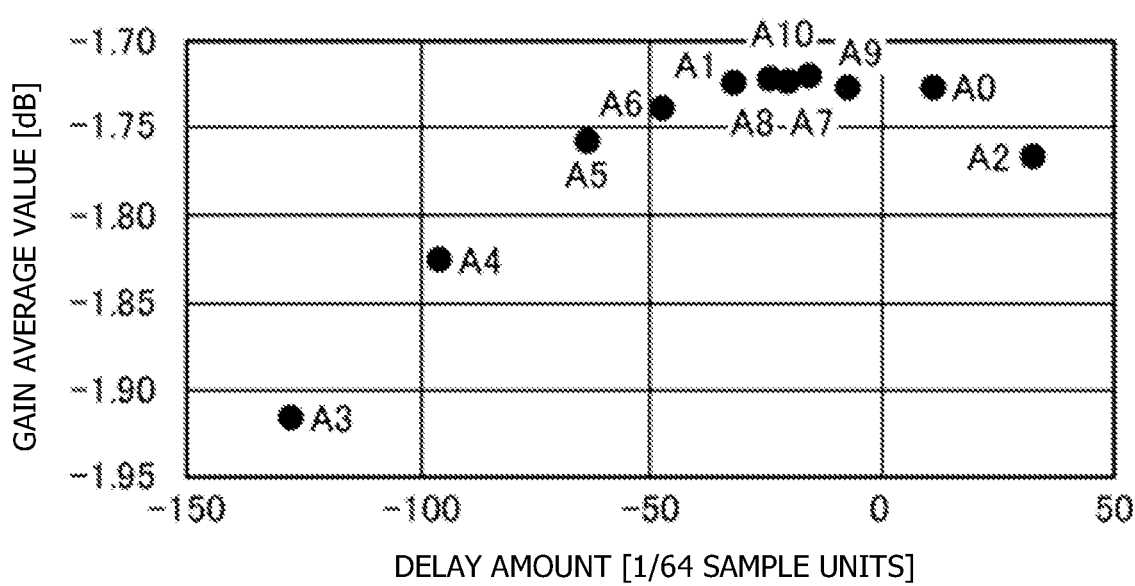
FIG. 13 is an explanatory graph illustrating an example of a method of determining a first-ranked largest first delay value and a second-ranked largest first delay value.

FIG. 13 is an explanatory graph illustrating an example of a method of determining a first-ranked largest first delay value and a second-ranked largest first delay value. The gain average value in the High region of the provisional delay value "11" illustrated in FIG. 13 is assumed to be "A0". In the case of i=0, the gain average value in the High region with the first delay value "−32" is assumed to be "A1", and the gain average value in the High region with the first delay value "32" is assumed to be "A2". As a result, when i=0, the first-ranked largest first delay value is "−32" corresponding to the gain average value "A1" in the High region, and the second-ranked largest first delay value is "11" corresponding to the gain average value "A0" in the High region.

Moreover, in the case of i=1, the gain average value in the High region with the first delay value "−128" is assumed to be "A3", the gain average value in the High region with the first delay value "−96" is assumed to be "A4", and the gain average value in the High region with the first delay value "−64" is assumed to be "A5". As a result, when i=1, the first-ranked largest first delay value is "−32" corresponding to the gain average value "A1" in the High region, and the second-ranked largest first delay value is "11" corresponding to the gain average value "A0" in the High region.

Moreover, in a case of i=2, the gain average value in the High region with the first delay value "−48" is assumed to be "A6", and the gain average value in the High region with the first delay value "−16" is assumed to be "A7". As a result, when i=2, the first-ranked largest first delay value is "−16" corresponding to the gain average value "A7" in the High region, and the second-ranked largest first delay value is "−32" corresponding to the gain average value "A1" in the High region.

Moreover, in a case of i=3, the gain average value in the High region with the first delay value "−24" is assumed to be "A8", and the gain average value in the High region with the first delay value "−8" is assumed to be "A9". As a result, when i=3, the first-ranked largest first delay value is "−16" corresponding to the gain average value "A7" in the High region, and the second-ranked largest first delay value is "−32" corresponding to the gain average value "A1" in the High region.

The determination unit 54 in the control unit 46 determines whether or not the calculated gain average value in the High region exceeds the gain average value of the first-ranked largest first delay value (operation S108). Note that the first-ranked largest first delay value is a first delay value at which the gain average value in the High region becomes the largest. In a case where the gain average value in the High region exceeds the gain average value of the first-ranked largest first delay value (operation S108: Yes), the determination unit 54 executes update processing of updating the first-ranked largest first delay value as the first-ranked set parameter (operation S109). The update processing updates the first-ranked largest first delay value with the second-ranked largest first delay value, the gain average value of the first-ranked largest first delay value with the gain average value of the second-ranked largest first delay value, the set value of the first-ranked largest first delay value with the current set value, and the gain average value with the first-ranked largest gain average value. Note that the second-ranked largest first delay value is a first delay value at which the gain average value in the High region is the second rank from the top.

After executing the update processing of updating the first-ranked largest first delay value and the second-ranked largest first delay value, the control unit 46 increments the number of delay shift trials by +1 (operation S110), and proceeds to operation S103 in order to determine whether or not the number of delay shift trials is i=N.

In a case where the gain average value in the High region does not exceed the gain average value of the first-ranked largest first delay value (operation S108: No), the determination unit 54 determines whether or not the gain average value in the High region exceeds the gain average value of the second-ranked largest first delay value (operation S111). In a case where the gain average value in the High region exceeds the gain average value of the second-ranked largest first delay value (operation S111: Yes), the determination unit 54 executes update processing of updating the second-ranked largest first delay value as the second-ranked set parameter (operation S112). The update processing of operation S112 updates the second-ranked largest first delay value with the current set value, and stores the gain average value as the second-ranked largest gain average value. After executing the update processing of operation S112, the control unit 46 proceeds to the processing of operation S110 in order to increment the number of delay shift trials by +1. Furthermore, in a case where the gain average value in the High region has not exceeded the gain average value of the second-ranked largest first delay value (operation S111: No), the determination unit 54 proceeds to the processing of operation S110 in order to increment the number of delay shift trials by +1.

In a case where the number of delay shift trials is i=N−1 (operation S103A: Yes), the control unit 46 sets the first delay value calculated by (the first-ranked largest first delay value+the second-ranked largest first delay value)/2 to the delay adjustment unit 42 (operation S113), and proceeds to the processing of operation S105. For example, when i=4, the provisional first delay value is (the first-ranked largest first delay value+the second-ranked largest first delay value)/2, for example, (−16−32)/2=−24, as illustrated in FIG. 13.

In a case where the number of delay shift trials is i=N (operation S103: Yes), the determination unit 54 determines the first-ranked largest first delay value as the optimum first delay value c (operation S114). As a result, when i=4, the gain average value "A7" that is the first-ranked largest first delay value "−16" is determined as the optimum first delay value c. The determination unit 54 sets the optimum first delay value c in the delay adjustment unit 42 (operation S115) and terminates the processing operation illustrated in FIG. 12.

In the first delay value determination processing illustrated in FIG. 12, the optimum first delay value c is determined from the first-ranked largest first delay value and the second-ranked largest first delay value at which the gain average value in the High region is large.

Figure 14:
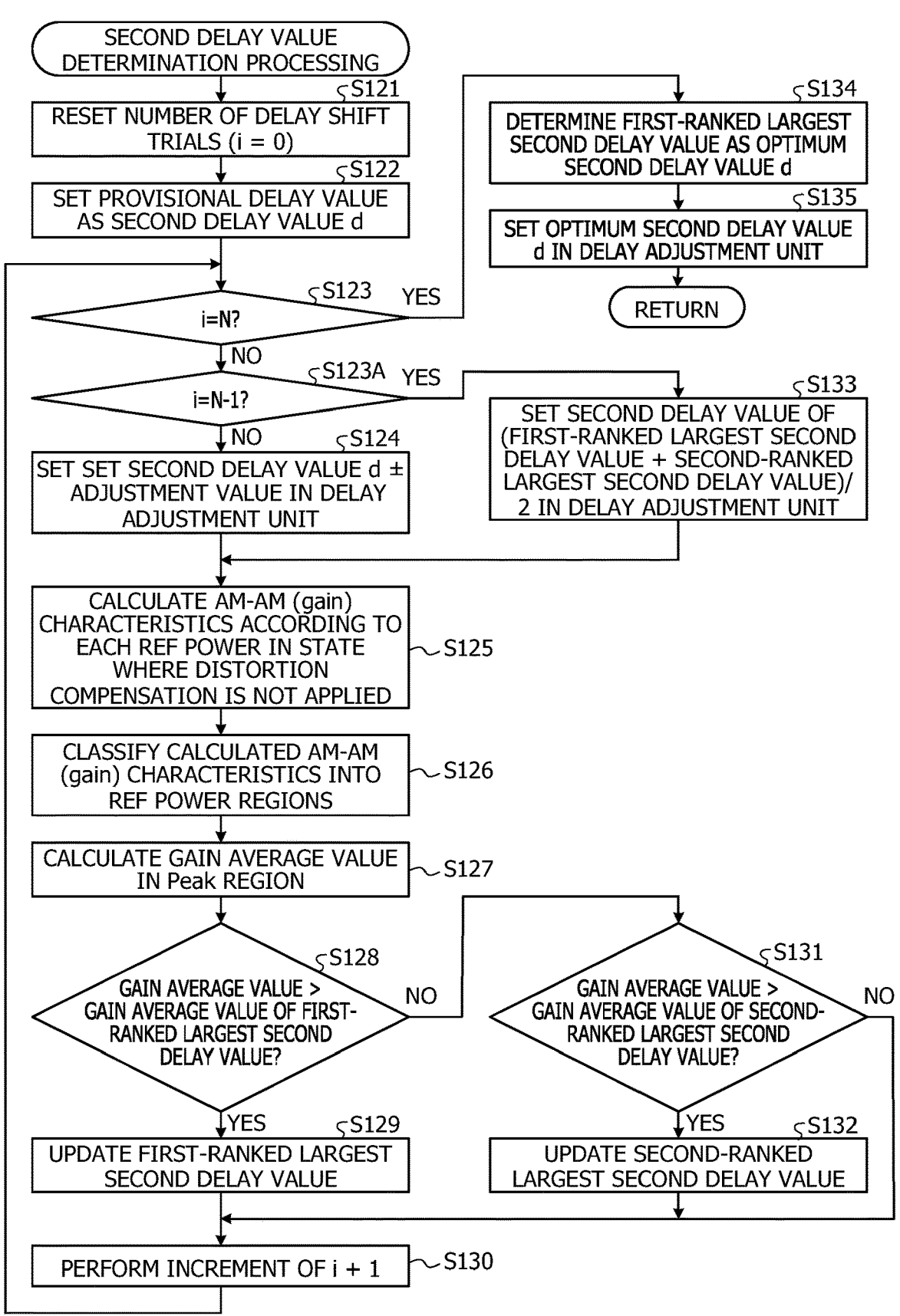
FIG. 14 is a flowchart illustrating an example of a processing operation of a control unit related to second delay value determination processing.

FIG. 14 is a flowchart illustrating an example of a processing operation of the control unit 46 related to the second delay value determination processing. In FIG. 14, the control unit 46 sets the number of delay shift trials i to "0" (operation S121) and sets the provisional delay value as the second delay value (d=c+a) (operation S122). Note that, for convenience of description, the largest number of delay shift trials is N=5, but the number is not limited to 5 and may be changed as appropriate. α is assumed to be 10. The control unit 46 determines whether or not the set number of delay shift trials is i=N (operation S123).

In a case where the number of delay shift trials is not i=N (operation S123: No), the control unit 46 determines whether or not the number of delay shift trials is i=N−1 (operation S123A). In a case where the number of delay shift trials is not i=N−1 (operation S123A: No), the control unit 46 sets the second delay value d obtained by adding the current second delay value±an adjustment value to the delay adjustment unit 42 in order to shift the delay (operation S124). Note that in a case where the number of delay shift trials is i=0, for example, the adjustment value is assumed to be 32 and the set second delay value d is assumed to be ±32. In a case where the number of delay shift trials is i=1, for example, in a case where the first-ranked smallest second delay value d1 that is the current second delay value is 32, the set second delay values d are assumed to be 64, 96, and 128, and in a case where the current second delay value d is −32, the set second delay values are assumed to be −128, −96, and −64. Moreover, in a case where the number of delay shift trials is i=2, the first-ranked smallest set second delay value d1 that is the current second delay value and the adjustment value are assumed to be ±16, and in a case where the number of delay shift trials is i=3, the first-ranked smallest second delay value d1 that is the current set second delay value and the adjustment value are assumed to be ±8.

After setting the second delay value d in the delay adjustment unit 42 in operation S124, the first calculation unit 51 in the control unit 46 calculates the AM-AM (gain) characteristics in the state where distortion compensation is not applied (operation S125). Note that the first calculation unit 51 calculates the AM-AM (gain) characteristics based on the FB signal and the REF signal in the state where distortion compensation is not applied by the DPD 10.

After calculating the AM-AM (gain) characteristics, the classification unit 52 in the control unit 46 classifies the calculated AM-AM (gain) characteristics into the Low region, the High region, and the Peak region according to the level of the REF power (operation S126). Moreover, the second calculation unit 53 in the control unit 46 calculates the gain average value in the Peak region from the AM-AM (gain) characteristics (operation S127).

The determination unit 54 in the control unit 46 determines whether or not the calculated gain average value in the Peak region exceeds the gain average value of the first-ranked largest second delay value (operation S128). Note that the first-ranked largest second delay value is a second delay value at which the gain average value in the Peak region becomes the largest. In a case where the gain average value in the Peak region exceeds the gain average value of the first-ranked largest second delay value (operation S128: Yes), the determination unit 54 executes update processing of updating the first-ranked largest second delay value as the first-ranked set parameter (operation S129). The update processing updates the first-ranked largest second delay value with the second-ranked largest second delay value, the gain average value of the first-ranked largest second delay value with the gain average value of the second-ranked largest second delay value, the set value of the first-ranked largest second delay value with the current set value, and the gain average value with the first-ranked largest gain average value. Note that the second-ranked largest second delay value is a second delay value at which the gain average value in the Peak region is the second rank from the top.

After executing the update processing of updating the first-ranked largest second delay value and the second-ranked largest second delay value, the control unit 46 increments the number of delay shift trials by +1 (operation S130), and proceeds to operation S123 in order to determine whether or not the number of delay shift trials is i=N.

In a case where the gain average value in the Peak region does not exceed the gain average value of the first-ranked largest second delay value (operation S128: No), the determination unit 54 determines whether or not the gain average value in the Peak region exceeds the gain average value of the second-ranked largest second delay value (operation S131). In a case where the gain average value in the Peak region exceeds the gain average value of the second-ranked largest second delay value (operation S131: Yes), the determination unit 54 executes update processing of updating the second-ranked largest second delay value as the second-ranked set parameter (operation S132). The update processing of operation S132 updates the second-ranked largest second delay value with the current set value, and stores the gain average value as the second-ranked largest gain average value. After executing the update processing of operation S132, the control unit 46 proceeds to the processing of operation S130 in order to increment the number of delay shift trials by +1. Furthermore, in a case where the gain average value in the Peak region has not exceeded the gain average value of the second-ranked largest second delay value (operation S131: No), the determination unit 54 proceeds to the processing of operation S130 in order to increment the number of delay shift trials by +1.

In a case where the number of delay shift trials is i=N−1 (operation S123A: Yes), the control unit 46 sets the second delay value calculated by (the first-ranked largest second delay value+the second-ranked largest second delay value)/2 to the delay adjustment unit 42 (operation S133), and proceeds to the processing of operation S125. Then, in a case where the number of delay shift trials is i=N (operation S123: Yes), the determination unit 54 determines the first-ranked largest second delay value as the optimum second delay value d (operation S134). The determination unit 54 sets the optimum second delay value d in the delay adjustment unit 42 (operation S135) and terminates the processing operation illustrated in FIG. 14.

In the second delay value determination processing illustrated in FIG. 14, the optimum second delay value d is determined from the first-ranked largest second delay value and the second-ranked largest second delay value at which the gain average value in the Peak region is large.

The Doherty amplification device 1 of the first embodiment includes the adjustment unit 26 that is arranged between the distribution unit 21 and the PA 23C and adjusts the phase value and the delay value of the second signal from the distribution unit 21. The adjustment unit 26 calculates the AM-AM (gain) characteristics based on the FB signal and the REF signal. The adjustment unit 26 classifies the calculated AM-AM (gain) characteristics into a plurality of regions according to the level of the REF power. The adjustment unit 26 calculates the statistical value of the gain for each of the classified regions, and sets the phase value and the delay value with the best radio characteristics in the adjustment unit 26 based on the calculated statistical value for each of the regions. As a result, it is possible to significantly shorten the time to adjust the phase difference and the delay difference between the paths of the CA 22C and the PA 23C in the two-input Doherty amplification unit 20 so as to obtain the best distortion characteristics. For example, while the existing manual adjustment takes time of about 1 hour, the present embodiment performs adjustment in about 2 minutes because of automatic adjustment.

Moreover, since the Doherty amplification device 1 performs the adjustment using the FB signal and the REF signal in its own device, an external measurement device as in the related art becomes unnecessary. For example, the external measurement device monitors average power of output of the power amplifier, whereas the Doherty amplification device 1 monitors the FB signal and the REF signal in sample units, and thus performs highly accurate correction. Moreover, the Doherty amplification device 1 uses the phase value and the delay value for adjustment, and thus performs highly accurate correction.

The first calculation unit 51 sets the predetermined phase value and the predetermined delay value in the adjustment unit 26 in the state where distortion compensation is not applied, and then calculates the AM-AM (gain) characteristics based on the FB signal and the REF signal. As a result, it is possible to obtain the AM-AM (gain) characteristics in the state where distortion compensation is not applied in the DPD 10.

The adjustment unit 26 includes the phase adjustment unit 41 that adjusts the phase value of the second signal, and the delay adjustment unit 42 that is coupled in series to the phase adjustment unit 41 and adjusts the delay value of the second signal. The adjustment unit 26 sets the set phase value at which the gain average value in the Peak region becomes the largest in the phase adjustment unit 41, and sets the set delay value at which the gain average value in the High region becomes the largest in the delay adjustment unit 42. The linearity is improved by reducing the decrease in the gain in the Peak region. Moreover, the memory effect of the amplifier is reduced by reducing the variation in the gains of the High region and the Low region. As a result, the radio characteristics will be improved. For example, the adjustment unit 26 adjusts the phase value and the delay value of the PA 23C so as to maximize the gain near saturation power after Doherty combining and eliminate the variation in gain and phase. As a result, the radio characteristics are optimized.

Note that the case of determining the provisional phase value, the optimum first phase value, the optimum second phase value, and the optimum second delay value with the gain average value in the Peak region, determining the optimum first delay value with the gain average value in the High region, and determining the provisional delay value with the gain standard deviation value in the High region has been exemplified. However, the target regions and the statistical values are changed according to the amplifier characteristics to be used, and the present embodiment is not limited to the case.

Note that a case where the phase adjustment unit 41 and the delay adjustment unit 42 are arranged in series in the second path in which the PA 23C is arranged in the adjustment unit 26 in the Doherty amplification device 1 of the first embodiment has been exemplified. However, the amplitude adjustment unit 47 may be arranged in series in addition to the phase adjustment unit 41 and the delay adjustment unit 42, and an embodiment thereof will be described below as a second embodiment.

Second Embodiment

Figure 15:
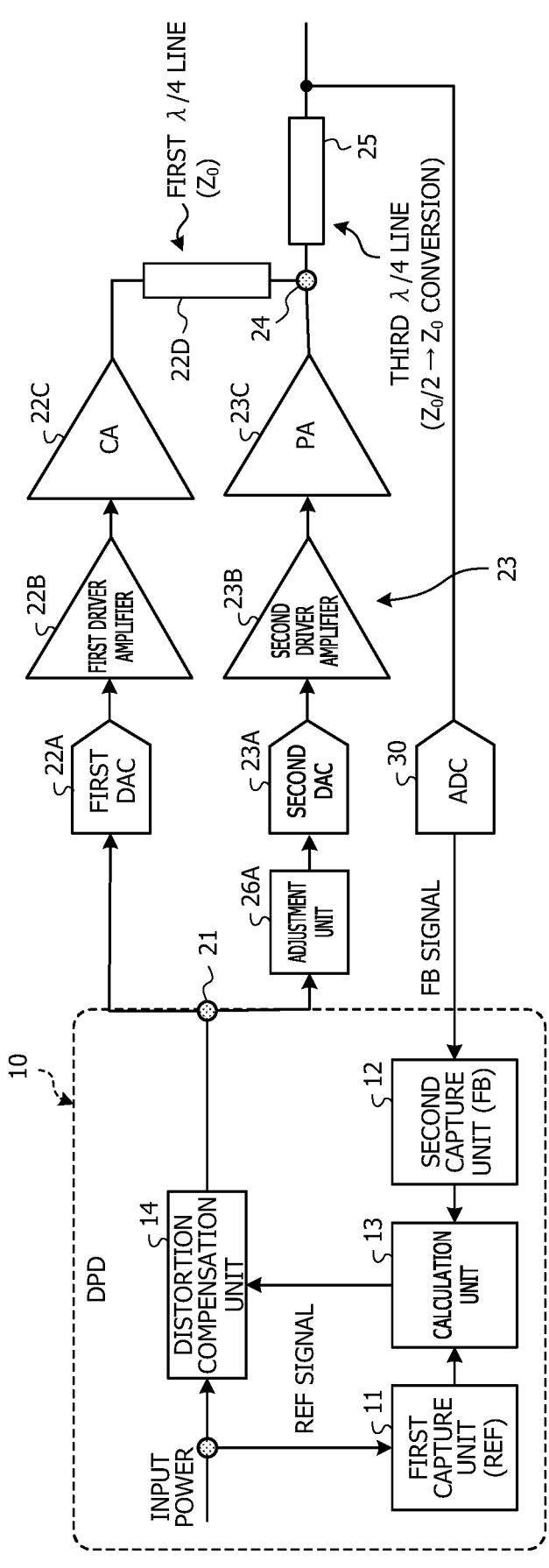
FIG. 15 is an explanatory diagram illustrating an example of a Doherty amplification device according to a second embodiment.

FIG. 15 is an explanatory diagram illustrating an example of a Doherty amplification device 1A according to the second embodiment. Note that the same reference signs as those of the Doherty amplification device 1 of the first embodiment are given the same configurations, and redundant description of these configurations and operations is omitted. The Doherty amplification device 1A illustrated in FIG. 15 is different from the Doherty amplification device 1 illustrated in FIG. 1 in the configuration of an adjustment unit 26A.

Figure 16:
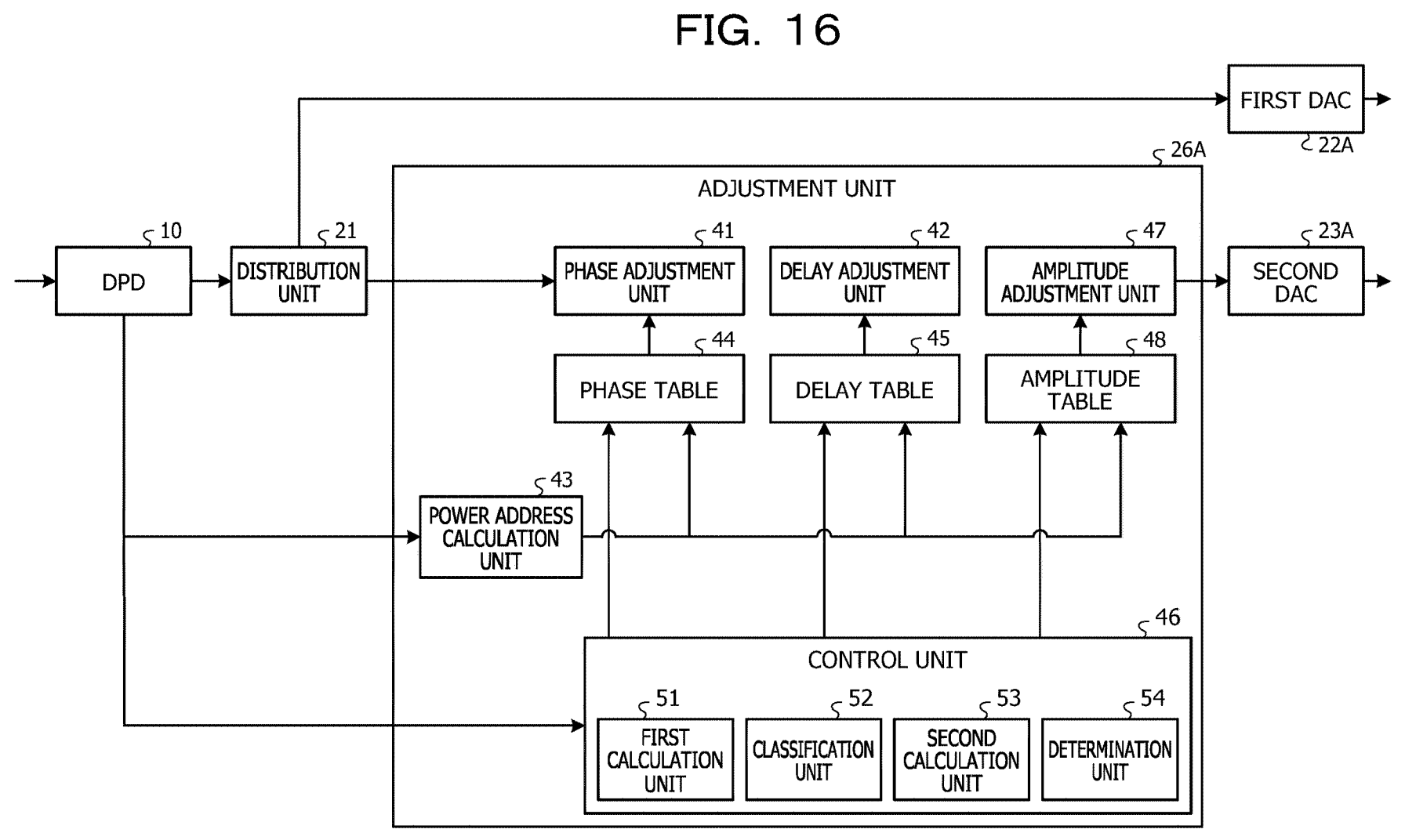

FIG. 16 is an explanatory diagram illustrating an example of the adjustment unit 26A of the second embodiment. The adjustment unit 26A illustrated in FIG. 16 includes a phase adjustment unit 41, a delay adjustment unit 42, a phase table 44, a delay table 45, a power address calculation unit 43, and a control unit 46. Moreover, the adjustment unit 26A includes an amplitude adjustment unit 47 arranged in a subsequent stage of the delay adjustment unit 42 in a second path in which a PA 23C is arranged, and an amplitude table 48 that stores a plurality of amplitude patterns.

Figure 17:
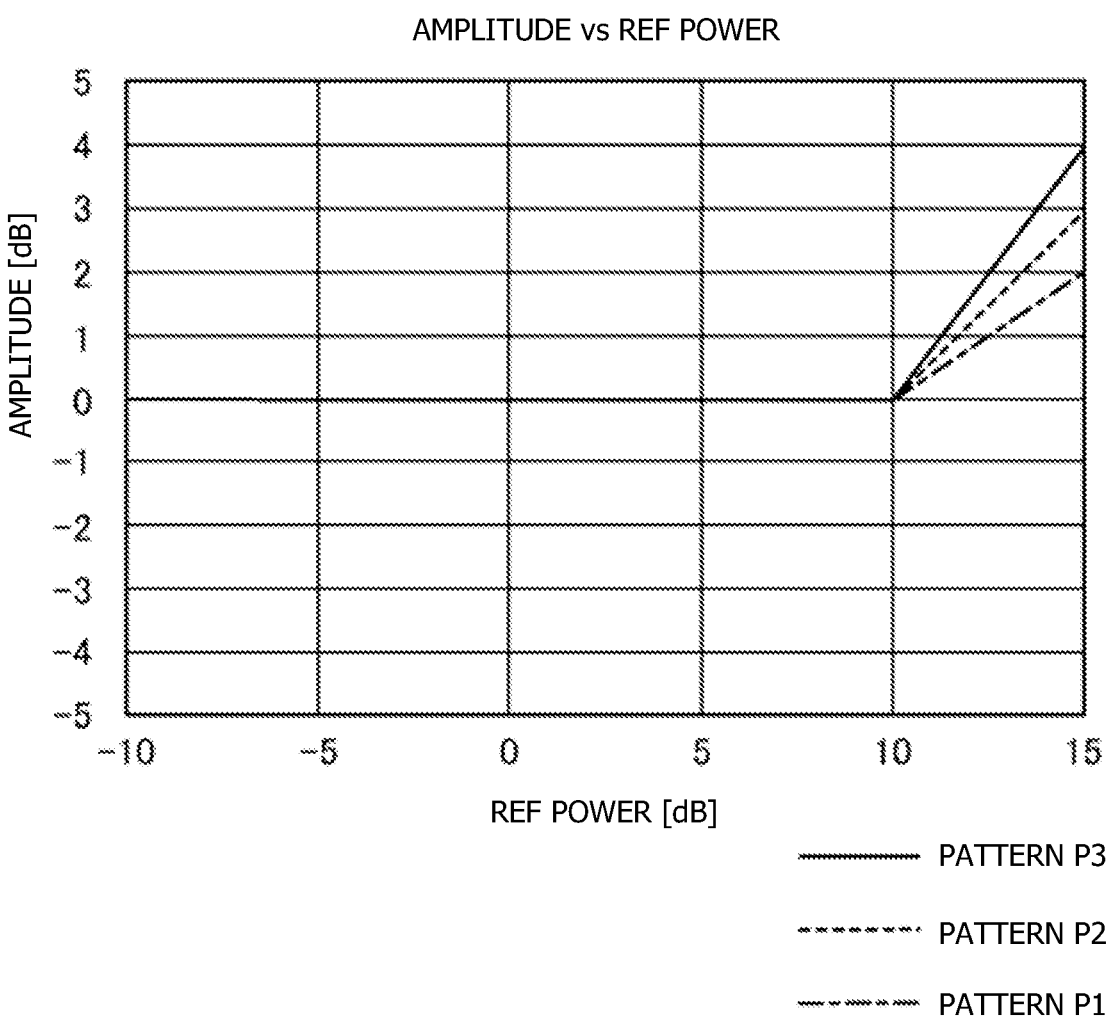
FIG. 17 is an explanatory graph illustrating an example of an amplitude table.

FIG. 17 is an explanatory graph illustrating an example of the amplitude table 48. The amplitude table 48 illustrated in FIG. 17 manages in advance the amplitude pattern of the amplitude adjustment unit 47 according to REF power with which radio characteristics become the best. The amplitude adjustment unit 47 sequentially sets the plurality of amplitude patterns in the amplitude table 48. The amplitude pattern is a characteristic pattern of amplitude according to the REF power with which the radio characteristics are improved. Note that, for convenience of description, it is assumed that three types of amplitude patterns are managed in the amplitude table 48 illustrated in FIG. 17. A determination unit 54 sets, in the amplitude adjustment unit 47, a set amplitude pattern in which a gain standard deviation value, which is a statistical value for each set amplitude pattern in a High region, becomes the smallest.

FIG. 18 is a flowchart illustrating an example of a processing operation of the control unit 46 in the adjustment unit 26A related to second optimum value determination processing. In FIG. 18, after executing provisional delay determination processing for determining a provisional delay value in operation S12, the control unit 46 executes amplitude pattern determination processing illustrated in FIG. 19 for determining the optimum amplitude pattern (operation S140). Moreover, after determining the optimum amplitude pattern in operation S140, the control unit 46 executes second phase value determination processing in operation S13.

In the second optimum value determination processing, after the optimum amplitude pattern is determined, an optimum second phase value b, an optimum first phase value a, an optimum first delay value c, and an optimum second delay value d are sequentially determined.

Figure 19:
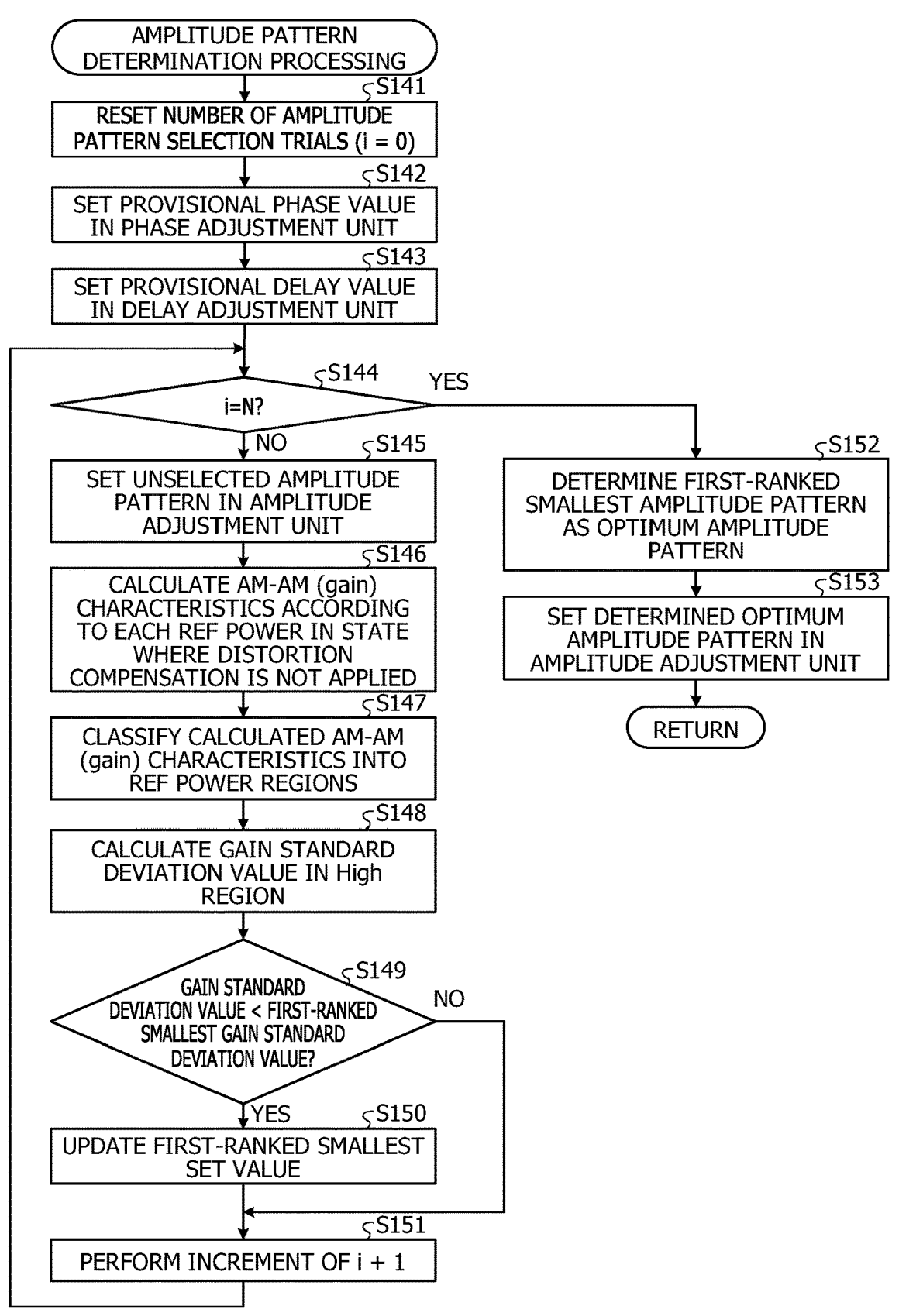
FIG. 19 is a flowchart illustrating an example of a processing operation of a control unit related to amplitude pattern determination processing.

FIG. 19 is a flowchart illustrating an example of a processing operation of the control unit 46 related to the amplitude pattern determination processing. In FIG. 19, the control unit 46 sets the number of amplitude pattern selection trials i to "0" (operation S141), and sets the provisional phase value in the phase adjustment unit 41 (operation S142). Moreover, the control unit 46 sets the provisional delay value in the delay adjustment unit 42 (operation S143). The control unit 46 determines whether or not the number of amplitude pattern selection trials is i=N (operation S144). Note that, for convenience of description, the largest number of amplitude pattern selection trials selectable in the amplitude table 48 is N=3, but the number is not limited to 3 and may be changed as appropriate.

In a case where the number of amplitude pattern selection trials is not i=N (operation S144: No), the control unit 46 sets an unselected amplitude pattern in the amplitude table 48 to the amplitude adjustment unit 47 (operation S145). After setting the unselected amplitude pattern to the amplitude adjustment unit 47 in operation S145, a first calculation unit 51 in the control unit 46 calculates AM-AM (gain) characteristics in a state where distortion compensation is not applied (operation S146). Note that the first calculation unit 51 calculates the AM-AM (gain) characteristics based on an FB signal and a REF signal in the state where distortion compensation is not applied by a DPD 10.

After calculating the AM-AM (gain) characteristics, a classification unit 52 in the control unit 46 classifies the calculated AM-AM (gain) characteristics into a Low region, the High region, and a Peak region according to a level of the REF power (operation S147). Moreover, a second calculation unit 53 in the control unit 46 calculates the gain standard deviation value in the High region from the AM-AM (gain) characteristics (operation S148).

The determination unit 54 in the control unit 46 determines whether or not the calculated gain standard deviation value in the High region is smaller than the gain standard deviation value of a first-ranked smallest amplitude pattern (operation S149). Note that the first-ranked smallest amplitude pattern is an amplitude pattern in which the gain standard deviation value in the High region becomes the smallest. In a case where the calculated gain standard deviation value in the High region is smaller than the gain standard deviation value of the first-ranked smallest amplitude pattern (operation S149: Yes), the determination unit 54 executes update processing of updating the first-ranked smallest amplitude pattern as a first-ranked set pattern (operation S150). The update processing of operation S150 updates a set value of the first-ranked smallest amplitude pattern with a current set value, and stores the gain standard deviation value as a first-ranked smallest gain standard deviation value.

After executing the update processing of operation S150, the control unit 46 increments the number of amplitude pattern selection trials by +1 (operation S151), and proceeds to operation S144 to determine whether or not the number of amplitude pattern selection trials is i=N. In a case where the calculated gain standard deviation value in the High region is not smaller than the gain standard deviation value of the first-ranked smallest amplitude pattern (operation S149: No), the determination unit 54 proceeds to the processing of operation S151 in order to increment the number of amplitude pattern selection trials by +1.

In a case where the number of amplitude pattern selection trials is i=N (operation S144: Yes), the control unit 46 determines the first-ranked smallest amplitude pattern as an optimum amplitude pattern (operation S152). Moreover, the determination unit 54 sets the determined optimum amplitude pattern in the amplitude adjustment unit 47 (operation S153) and terminates the processing operation illustrated in FIG. 19.

In the amplitude pattern determination processing illustrated in FIG. 19, the optimum amplitude pattern in which the gain standard deviation value in the High region becomes the smallest is determined.

The Doherty amplification device 1A of the second embodiment further includes the amplitude adjustment unit 47 that is coupled in series to the phase adjustment unit 41 or the delay adjustment unit 42 and adjusts the amplitude pattern of a second signal. The Doherty amplification device 1A sets, in the amplitude adjustment unit 47, a set amplitude pattern in which the gain standard deviation value in the High region becomes the smallest. As a result, since the amplitude pattern is used in addition to the phase value and the delay value in the adjustment, it is possible to perform highly accurate adjustment in consideration of the amplitude pattern. Note that the adjustment of the amplitude pattern also changes a target region and a statistical value according to amplifier characteristics, and the embodiment is not limited thereto.

Note that a case where the phase adjustment unit 41 and the delay adjustment unit 42 are arranged in series in the second path in which the PA 23C is arranged in the adjustment unit 26 in the Doherty amplification device 1 of the first embodiment has been exemplified. However, an amplitude frequency adjustment unit 47A may be arranged in series in addition to the phase adjustment unit 41 and the delay adjustment unit 42, and an embodiment thereof will be described below as a third embodiment.

Third Embodiment

Figure 20:
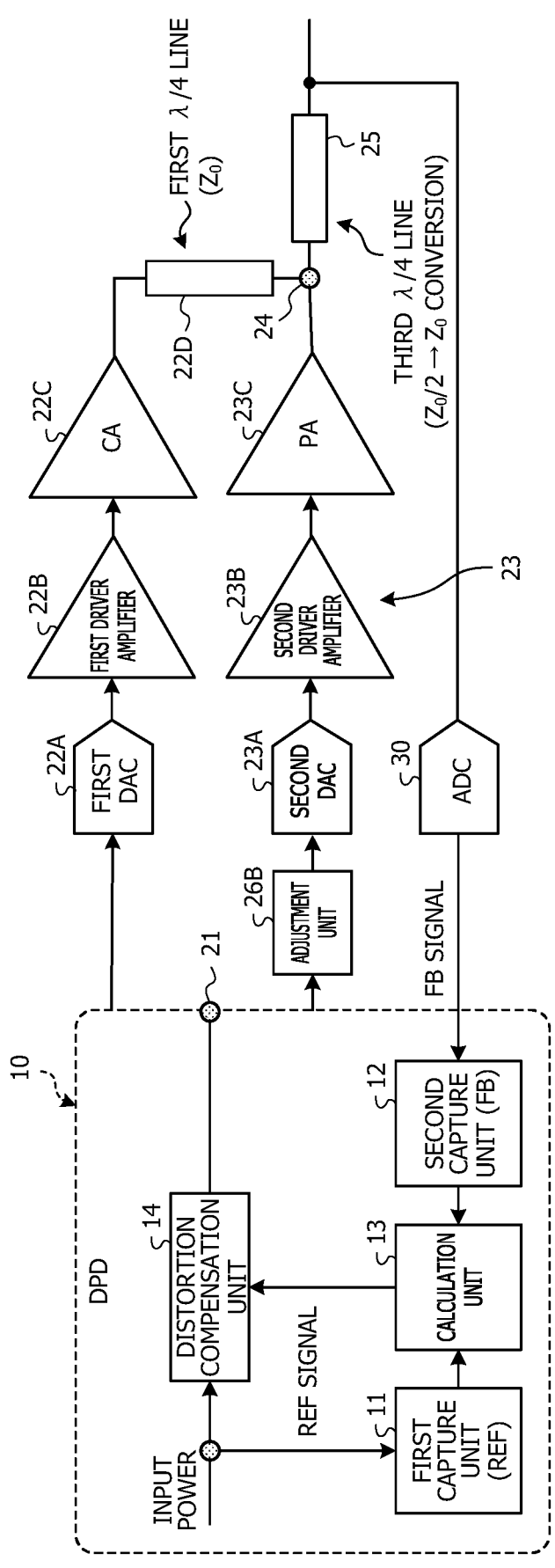
FIG. 20 is an explanatory diagram illustrating an example of a Doherty amplification device according to a third embodiment.

FIG. 20 is an explanatory diagram illustrating an example of a Doherty amplification device 18 according to the third embodiment. Note that the same reference signs as those of the Doherty amplification device 1 of the first embodiment are given the same configurations, and redundant description of these configurations and operations is omitted. The Doherty amplification device 18 illustrated in FIG. 20 is different from the Doherty amplification device 1 illustrated in FIG. 1 in the configuration of an adjustment unit 26B.

Figure 21:
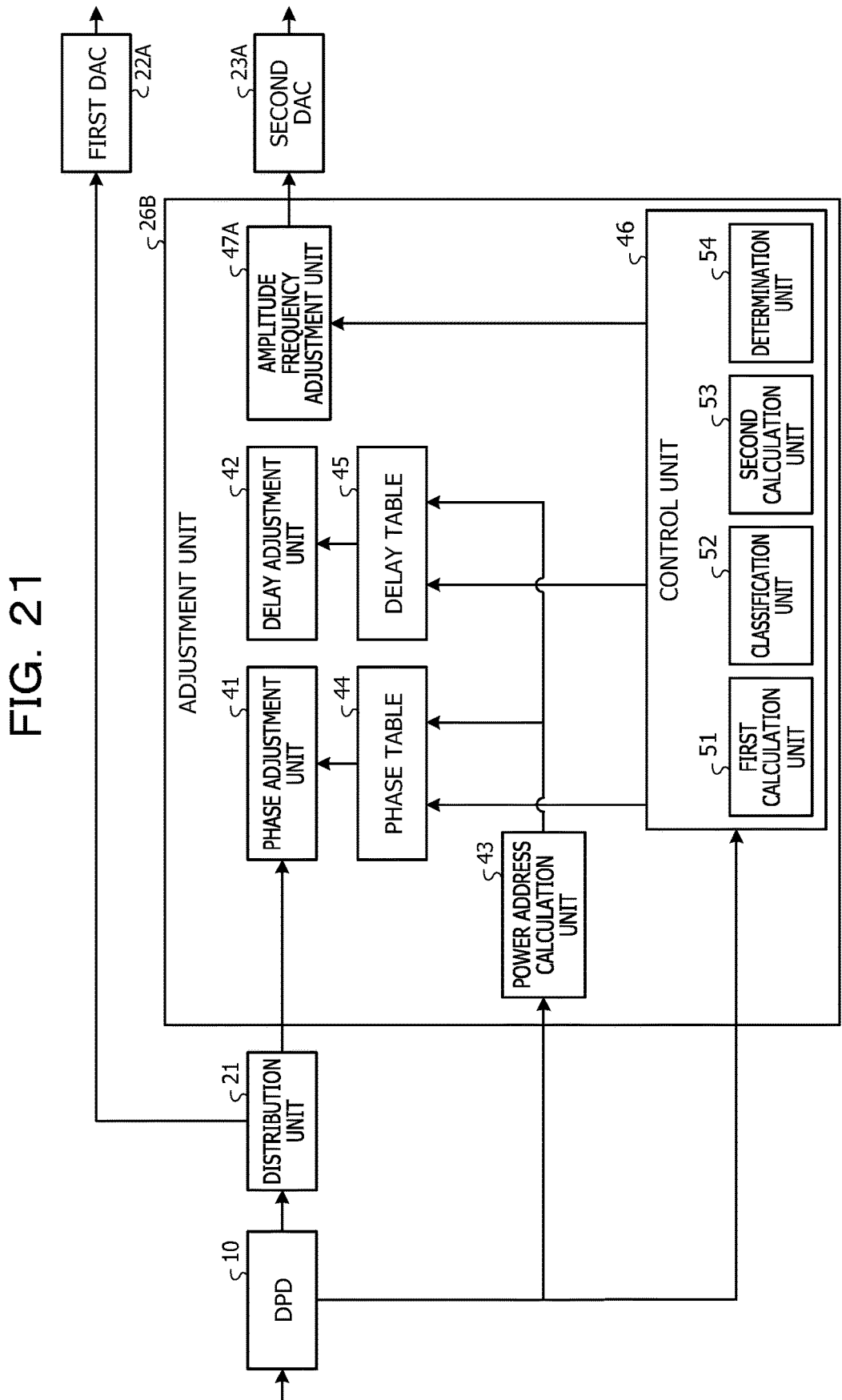
FIG. 21 is an explanatory diagram illustrating an example of an adjustment unit of the third embodiment.

FIG. 21 is an explanatory diagram illustrating an example of the adjustment unit 26B of the third embodiment. The adjustment unit 26B illustrated in FIG. 21 includes a phase adjustment unit 41, a delay adjustment unit 42, a phase table 44, a delay table 45, a power address calculation unit 43, and a control unit 46. Moreover, the adjustment unit 26B includes an amplitude frequency adjustment unit 47A arranged in a subsequent stage of the delay adjustment unit 42 in a second path in which a PA 23C is arranged.

Figure 22:
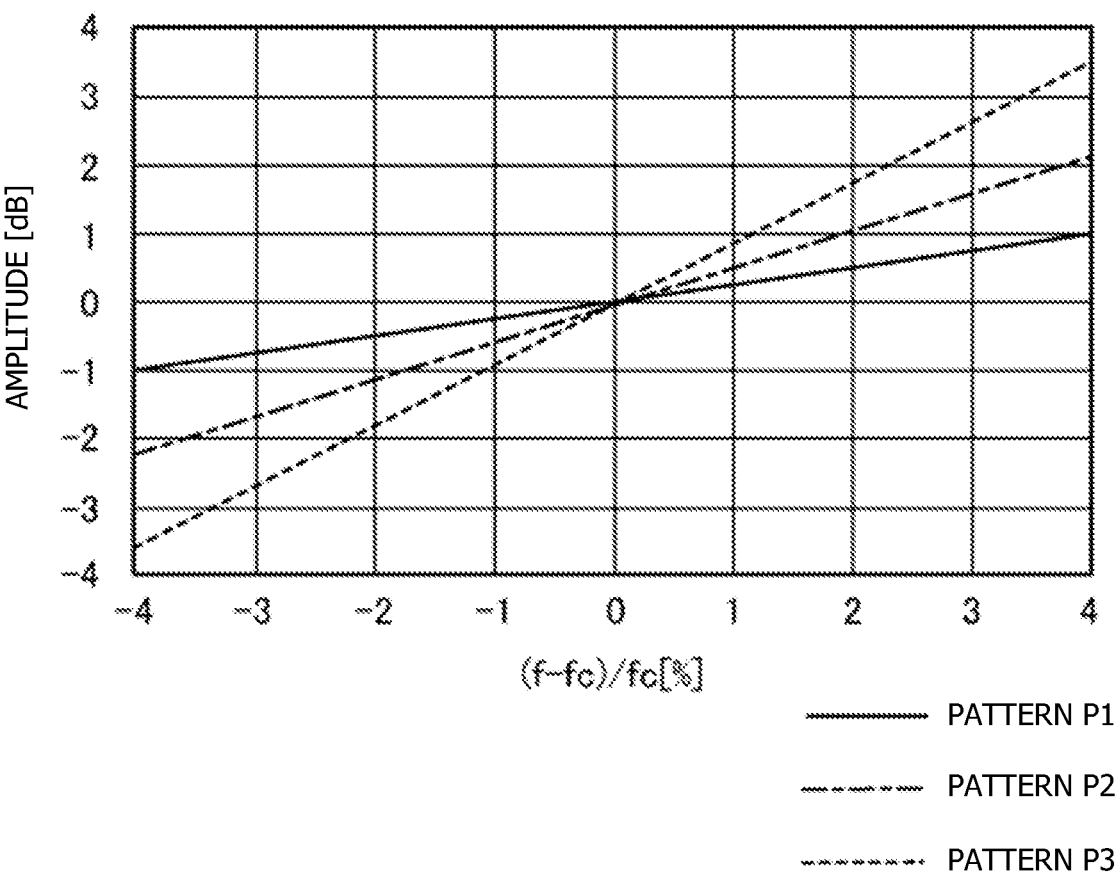
FIG. 22 is an explanatory graph illustrating an example of amplitude frequency correction patterns.

FIG. 22 is an explanatory graph illustrating an example of amplitude frequency correction patterns. The amplitude frequency correction patterns illustrated in FIG. 22 are amplitude frequency correction patterns of the amplitude frequency adjustment unit 47A according to REF power with which radio characteristics become the best. The vertical axis of the amplitude frequency correction pattern represents the amplitude, and the horizontal axis represents a normalized frequency (obtained by normalizing a difference between a frequency and a center frequency (fc) by fc). Note that, for convenience of description, the amplitude frequency correction patterns illustrated in FIG. 22 are three types of amplitude frequency correction patterns. The amplitude frequency adjustment unit 47A sequentially sets the plurality of amplitude frequency correction patterns. A determination unit 54 sets, in the amplitude frequency adjustment unit 47A, a set amplitude frequency correction pattern in which a gain standard deviation value in a High region becomes the smallest.

FIG. 23 is a flowchart illustrating an example of a processing operation of the control unit 46 in the adjustment unit related to third optimum value determination processing. In FIG. 23, after executing provisional delay determination processing for determining a provisional delay value in operation S12, the control unit 46 executes amplitude frequency correction pattern determination processing illustrated in FIG. 24 for determining an optimal amplitude frequency correction pattern (operation S160). Moreover, after determining the optimum amplitude frequency correction pattern in operation S160, the control unit 46 executes second phase value determination processing in operation S13.

In the third optimum value determination processing, after the optimum amplitude frequency correction pattern is determined, an optimum second phase value b, an optimum first phase value a, an optimum first delay value c, and an optimum second delay value d are sequentially determined.

Figure 24:
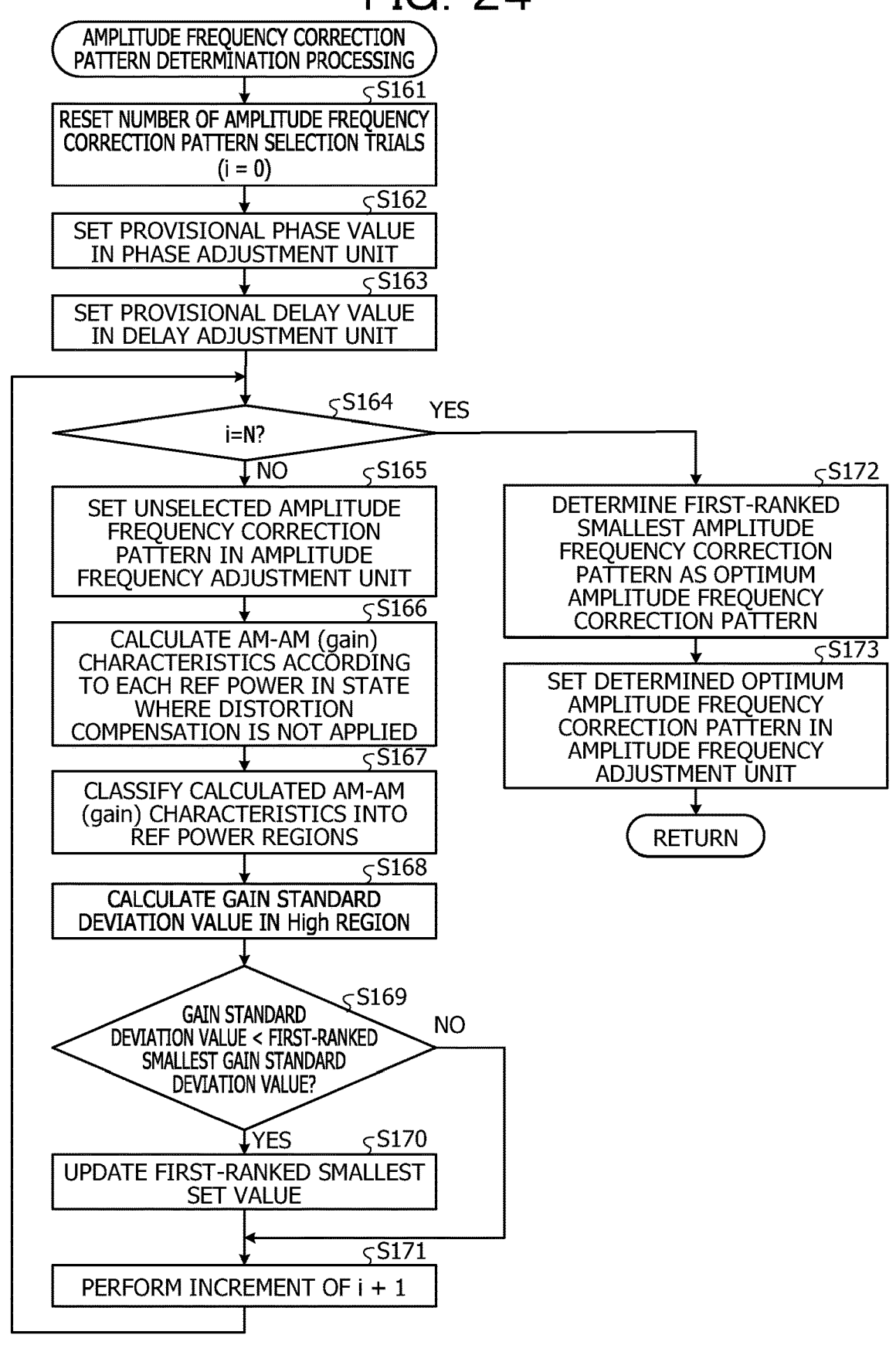
FIG. 24 is a flowchart illustrating an example of a processing operation of a control unit related to amplitude frequency correction pattern determination processing.

FIG. 24 is a flowchart illustrating an example of a processing operation of the control unit 46 related to the amplitude frequency correction pattern determination processing. In FIG. 24, the control unit 46 sets the number of amplitude frequency correction pattern selection trials i to "0" (operation S161), and sets a provisional phase value in the phase adjustment unit 41 (operation S162). Moreover, the control unit 46 sets the provisional delay value in the delay adjustment unit 42 (operation S163). The control unit 46 determines whether or not the number of amplitude frequency correction pattern selection trials is i=N (operation S164). Note that, for convenience of description, the selectable largest number of amplitude frequency correction pattern selection trials is 3, but the number is not limited to 3 and may be changed as appropriate.

When the number of amplitude frequency correction pattern selection trials is not i=2 (operation S164: No), the control unit 46 sets an unselected amplitude frequency correction pattern in the amplitude frequency adjustment unit 47A (operation S165). After setting the unselected amplitude frequency correction pattern to the amplitude adjustment unit 47A in operation S165, a first calculation unit 51 in the control unit 46 calculates AM-AM (gain) characteristics in a state where distortion compensation is not applied (operation S166). Note that the first calculation unit 51 calculates the AM-AM (gain) characteristics based on an FB signal and an REF signal in the state where distortion compensation is not applied by a DPD 10.

After calculating the AM-AM (gain) characteristics, a classification unit 52 in the control unit 46 classifies the calculated AM-AM (gain) characteristics into a Low region, the High region, and a Peak region according to the REF power (operation S167). Moreover, a second calculation unit in the control unit 46 calculates a gain standard deviation value in the High region from the AM-AM (gain) characteristics (operation S168).

A determination unit 54 in the control unit 46 determines whether or not the calculated gain standard deviation value in the High region is smaller than the gain standard deviation value of the first-ranked smallest amplitude frequency correction pattern (operation S169). Note that the first-ranked smallest amplitude frequency correction pattern is an amplitude frequency correction pattern in which the gain standard deviation value in the High region becomes the smallest. In a case where the calculated gain standard deviation value in the High region is smaller than the gain standard deviation value of the first-ranked smallest amplitude frequency correction pattern (operation S169: Yes), the determination unit 54 executes update processing of updating the first-ranked smallest amplitude frequency correction pattern as a first-ranked set pattern (operation S170). The update processing of operation S170 updates a set value of the first-ranked smallest amplitude frequency correction pattern with a current set value, and stores the gain standard deviation value as a first-ranked smallest gain standard deviation value.

After executing the update processing of operation S170, the control unit 46 increments the number of amplitude frequency correction pattern selection trials by +1 (operation S171), and proceeds to operation S164 to determine whether or not the number of amplitude frequency correction pattern selection trials is i=N. In a case where the calculated gain standard deviation value in the High region is not smaller than the gain standard deviation value of the first-ranked smallest amplitude frequency correction pattern (operation S169: No), the determination unit 54 proceeds to the processing of operation S171 in order to increment the number of amplitude frequency correction pattern selection trials by +1.

In a case where the number of amplitude frequency correction pattern selection trials is i=N (operation S164: Yes), the control unit 46 determines the first-ranked smallest amplitude frequency correction pattern as an optimum amplitude frequency correction pattern (operation S172). The determination unit 54 sets the determined amplitude frequency correction pattern in the amplitude frequency adjustment unit 47A (operation S173) and terminates the processing operation illustrated in FIG. 24.

In the amplitude frequency correction pattern determination processing illustrated in FIG. 24, the optimum amplitude frequency correction pattern in which the gain standard deviation value in the High region becomes the smallest is determined.

The Doherty amplification device 18 of the third embodiment further includes the amplitude frequency adjustment unit 47A that is coupled in series to the phase adjustment unit 41 or the delay adjustment unit 42 and adjusts the amplitude frequency correction pattern of a second signal. The Doherty amplification device 18 sets, in the amplitude frequency adjustment unit 47A, a set amplitude frequency correction pattern in which the gain standard deviation value in the High region becomes the smallest. As a result, since the amplitude frequency correction pattern is used in addition to the phase value and the delay value in the adjustment, it is possible to perform highly accurate adjustment in consideration of the amplitude frequency correction pattern. Note that the adjustment of the amplitude frequency correction pattern also changes a target region and a statistical value according to amplifier characteristics, and the embodiment is not limited thereto.

Note that the case where the Doherty amplification device 1 according to the first embodiment determines the provisional phase value, the first phase value, and the second phase value, using the gain average value having the first-ranked largest phase value and the second-ranked largest phase value, when determining the phase values, has been exemplified. Moreover, the case where the Doherty amplification device 1 determines the first delay value and the second delay value, using the gain average value having the first-ranked largest delay value and the second-ranked largest delay value, when determining the delay values, has been exemplified. Moreover, the case where the Doherty amplification device 1 determines the provisional delay value, using the gain standard deviation value having the first-ranked smallest delay value and the second-ranked smallest delay value, when determining the provisional delay value, has been exemplified. However, the second-ranked phase value and the second-ranked delay value may not be used, and an embodiment thereof will be described below as a fourth embodiment. Note that the same reference signs as those of the Doherty amplification device 1 of the first embodiment are given the same configurations, and redundant description of these configurations and operations is omitted.

Fourth Embodiment

Figure 25:
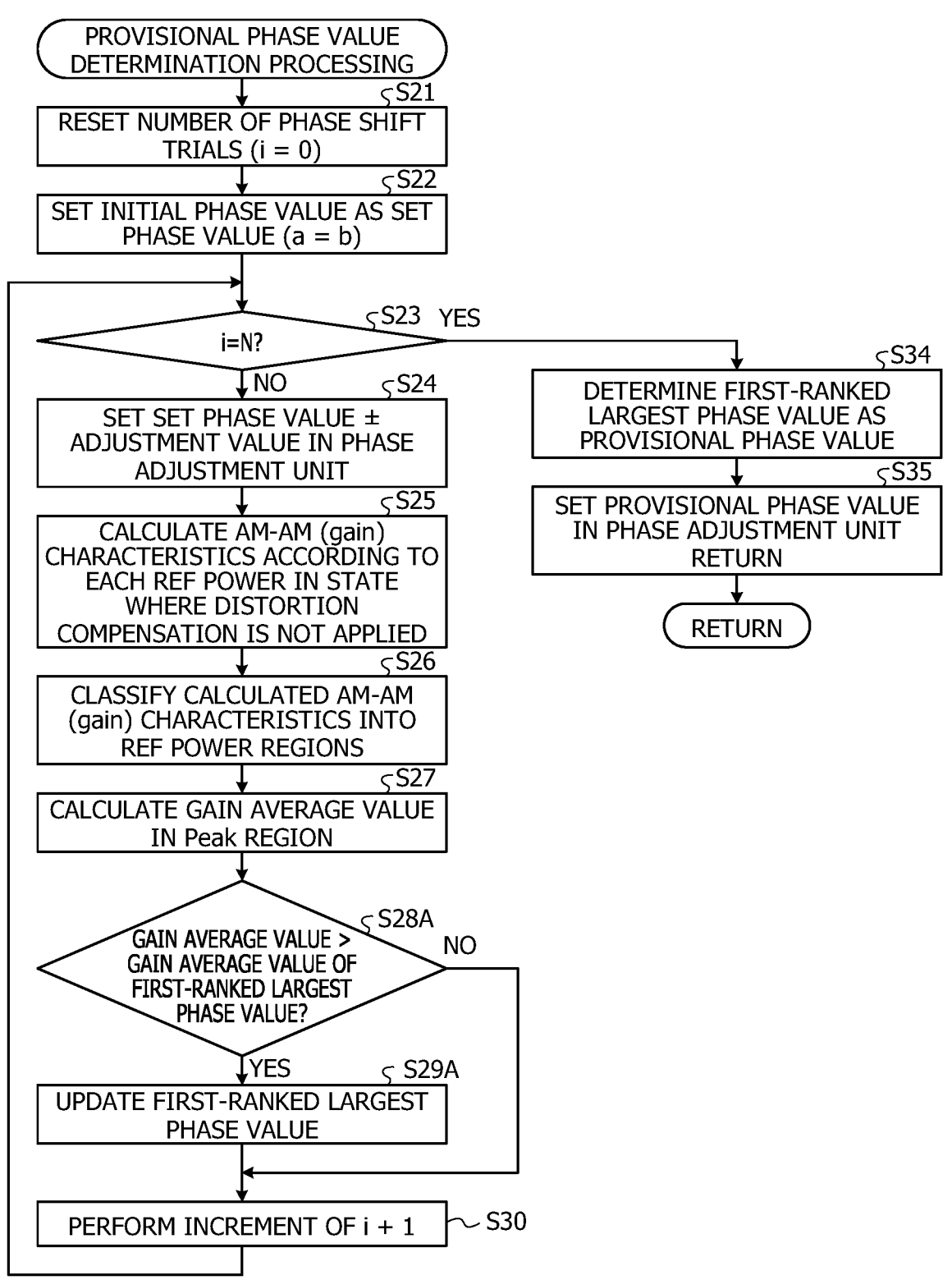
FIG. 25 is a flowchart illustrating an example of a processing operation of a control unit related to provisional phase value determination processing of a fourth embodiment.
Figure 26:
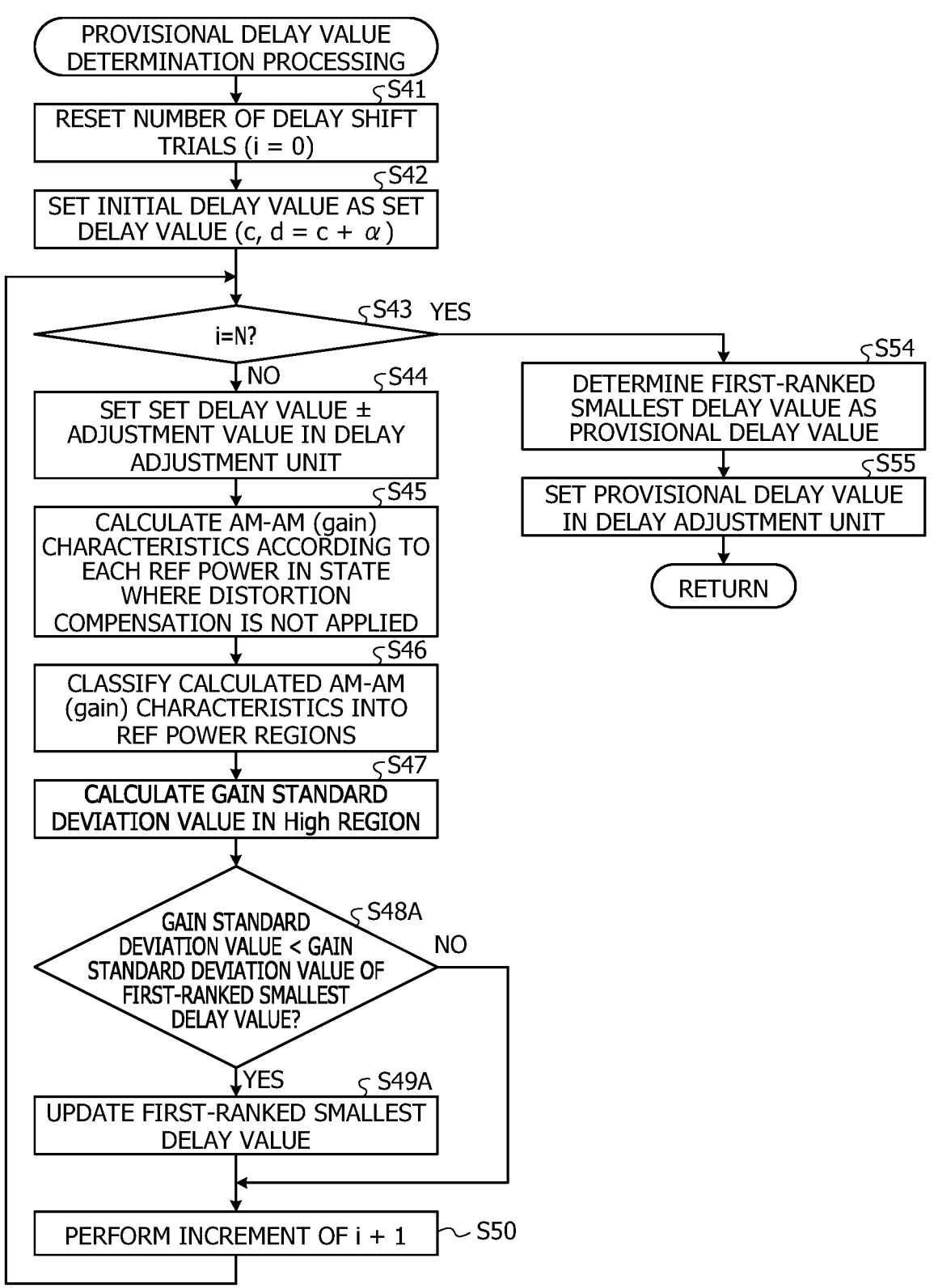
FIG. 26 is a flowchart illustrating an example of a processing operation of a control unit related to provisional delay value determination processing of the fourth embodiment.

A determination unit 54 executes provisional phase value determination processing illustrated in FIG. 25 instead of FIG. 7, and executes provisional delay value determination processing illustrated in FIG. 26 instead of FIG. 8.

FIG. 25 is a flowchart illustrating an example of a processing operation of a control unit 46 related to the provisional phase value determination processing of the fourth embodiment. In FIG. 25, the control unit 46 determines whether or not the set number of phase shift trials is i=N in operation S23.

In a case where the number of phase shift trials is not i=N (operation S23: No), the control unit 46 executes the processing of operation S24 for setting a first phase value a obtained by adding a current first phase value a±an adjustment value to a phase adjustment unit 41 in order to shift a phase.

Moreover, a second calculation unit in the control unit 46 calculates a gain average value in a Peak region from AM-AM (gain) characteristics in operation S27, and then determines whether or not a gain average value exceeds a gain average value of a first-ranked largest phase value (operation S28A). In a case where the gain average value exceeds the gain average value of the first-ranked largest phase value (operation S28A: Yes), the determination unit 54 executes update processing of updating the first-ranked largest phase value as a set parameter (operation S29A). The update processing of operation S29A updates a set value of the first-ranked largest phase value with a current set value, and stores the gain average value as the first-ranked largest gain average value.

After executing the update processing of updating the first-ranked largest phase value, the control unit 46 proceeds to the processing of operation S30 in order to increment the number of phase shift trials by +1. Furthermore, in a case where the gain average value has not exceeded the gain average value of the first-ranked largest phase value (operation S28A: No), the determination unit 54 proceeds to the processing of operation S30 in order to increment the number of phase shift trials by +1.

In a case where the number of phase shift trials is i=N (operation S23: Yes), the control unit 46 proceeds to processing of operation S34 in order to determine the first-ranked largest first phase value as a provisional phase value.

In the provisional phase value determination processing illustrated in FIG. 25, the provisional phase value is determined using the first-ranked largest phase value at which the gain average value in the Peak region becomes the largest. Note that, in first phase value determination processing and second phase value determination processing, an optimum first phase value and an optimum second phase value may be determined using only the first-ranked largest phase value.

FIG. 26 is a flowchart illustrating an example of a processing operation of the control unit 46 related to the provisional delay value determination processing of the fourth embodiment. In FIG. 26, in a case where the number of delay shift trials is not i=N in operation S43, the control unit 46 sets a set delay value obtained by adding the current set delay value±an adjustment value in operation S44 in a delay adjustment unit 42.

After calculating a gain standard deviation value in a High region from AM-AM (gain) characteristics in operation S47, a second calculation unit 53 determines whether or not the gain standard deviation value is smaller than the gain standard deviation value of a first-ranked smallest delay value (operation S48A). In a case where the calculated gain standard deviation value in the High region is smaller than the gain standard deviation value of the first-ranked smallest delay value (operation S48A: Yes), the determination unit 54 executes update processing of updating the first-ranked smallest delay value as a set parameter (operation S49A). The update processing of operation S49A updates the set value of the first-ranked smallest delay value with a current set value, and stores the gain standard deviation value as the first-ranked smallest gain standard deviation value.

After executing the update processing of updating the first-ranked smallest delay value, the control unit 46 proceeds to the processing of operation S50 in order to increment the number of delay shift trials by +1. Furthermore, in a case where the gain standard deviation value is not smaller than the gain standard deviation value of the first-ranked smallest delay value (operation S48A: No), the determination unit 54 proceeds to the processing of operation S50 in order to increment the number of delay shift trials by +1.

In a case where the number of delay shift trials is i=N in operation S43, the control unit 46 proceeds to the processing of operation S54 in order to determine the first-ranked smallest delay value as the provisional delay value.

In the provisional delay value determination processing illustrated in FIG. 26, the provisional delay value is determined using the first-ranked smallest delay value at which the gain standard deviation value in the High region becomes the smallest. Note that, in first delay value determination processing and second delay value determination processing, an optimum first delay value and an optimum second delay value may be determined using only the first-ranked delay value.

Note that the case where the Doherty amplification device 1 of the first embodiment has the adjustment unit 26 arranged in the second path in which the PA 23C is arranged because of adopting the two-input Doherty amplification unit 20 has been exemplified. However, in a case where a two-input inverse Doherty amplification unit is arranged instead of the two-input Doherty amplification unit 20, the adjustment unit 26 may be arranged in a first path in which a CA 22C is arranged. Furthermore, the case where the Doherty amplification device 1 of the first embodiment has the adjustment unit 26 arranged in the second path in which the PA 23C is arranged has been exemplified. However, the adjustment unit 26 may be arranged in both paths in which the CA 22C and the PA 23C are arranged and may be appropriately changed.

Furthermore, the case where the adjustment unit 26A in the Doherty amplification device 1A of the second embodiment includes the phase adjustment unit 41, the delay adjustment unit 42, and the amplitude adjustment unit 47 has been exemplified. However, the amplitude frequency adjustment unit 47A may be coupled in series in addition to the phase adjustment unit 41, the delay adjustment unit 42, and the amplitude adjustment unit 47. As a result, since the amplitude frequency correction pattern is used in addition to the phase value, the delay value and the amplitude pattern in the adjustment, it is possible to perform highly accurate adjustment in consideration of the amplitude pattern and the amplitude frequency pattern.

Figure 27:
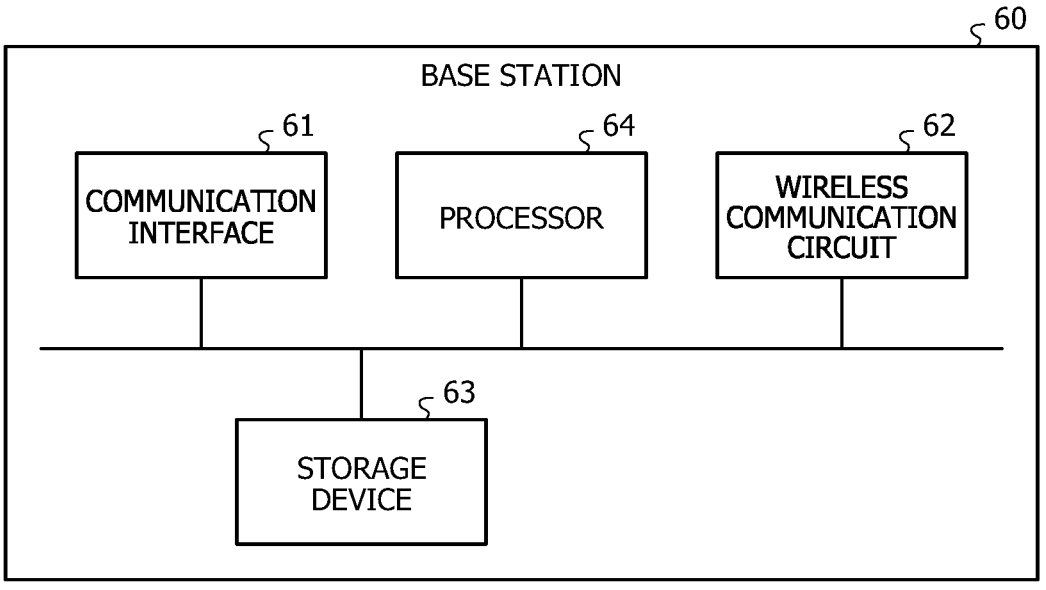
FIG. 27 is an explanatory diagram illustrating an example of a hardware configuration of a base station that is an example of application of the Doherty amplification device.
Figure 28A:
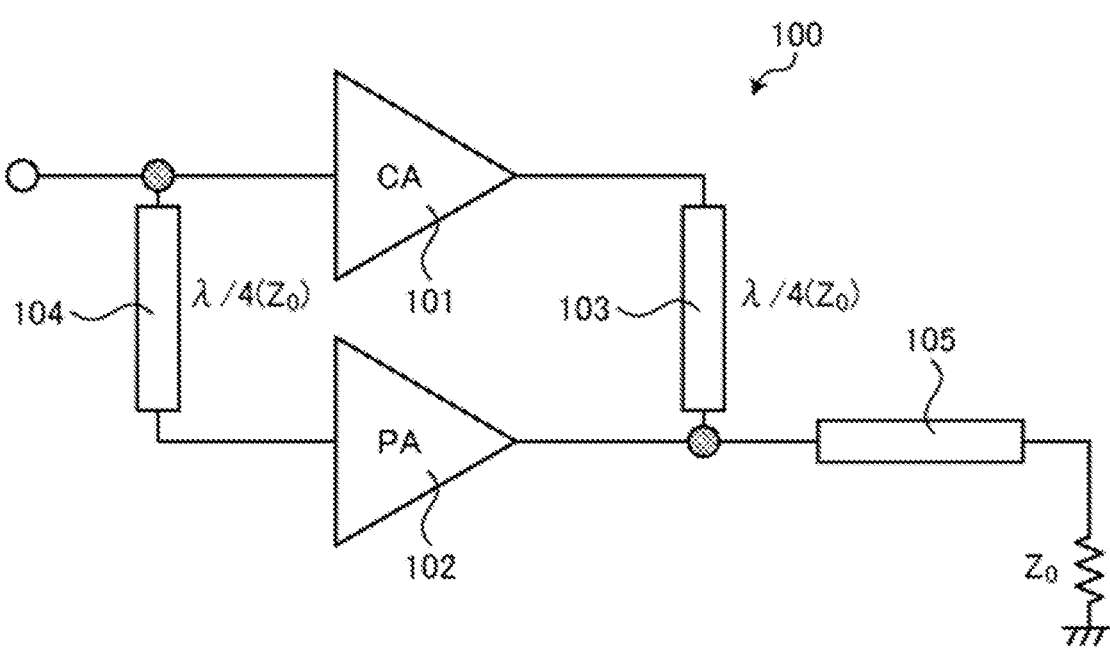
FIG. 28A is an explanatory diagram illustrating an example of an existing Doherty amplifier.
Figure 28B:
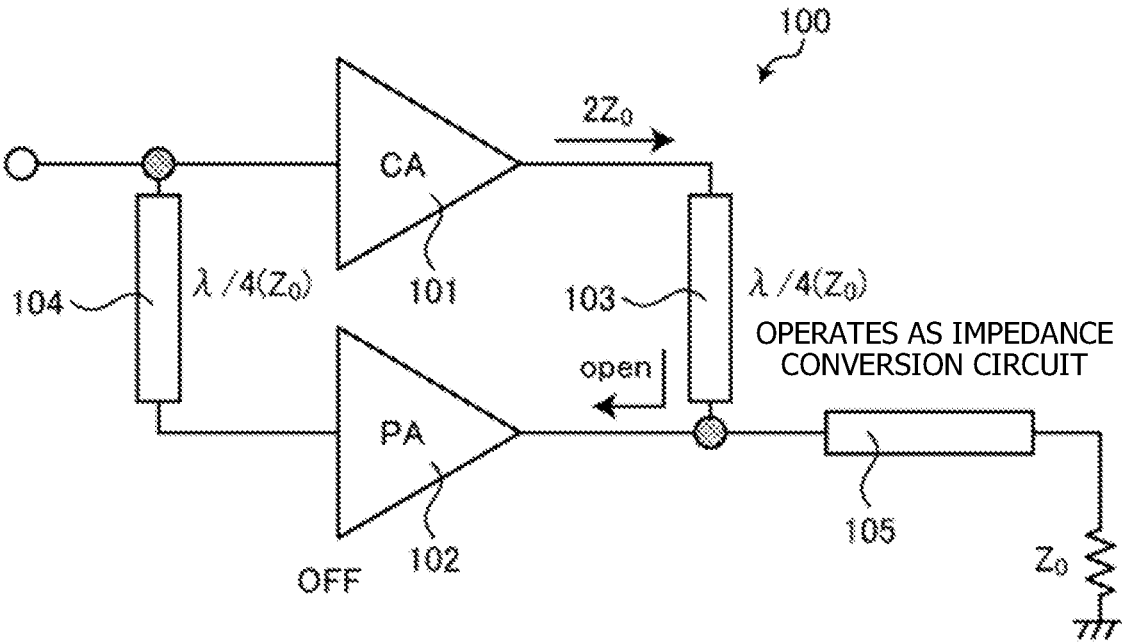
FIG. 28B is an explanatory diagram illustrating an example of an operation of the Doherty amplifier in a case where input power is less than a predetermined value.
Figure 28C:
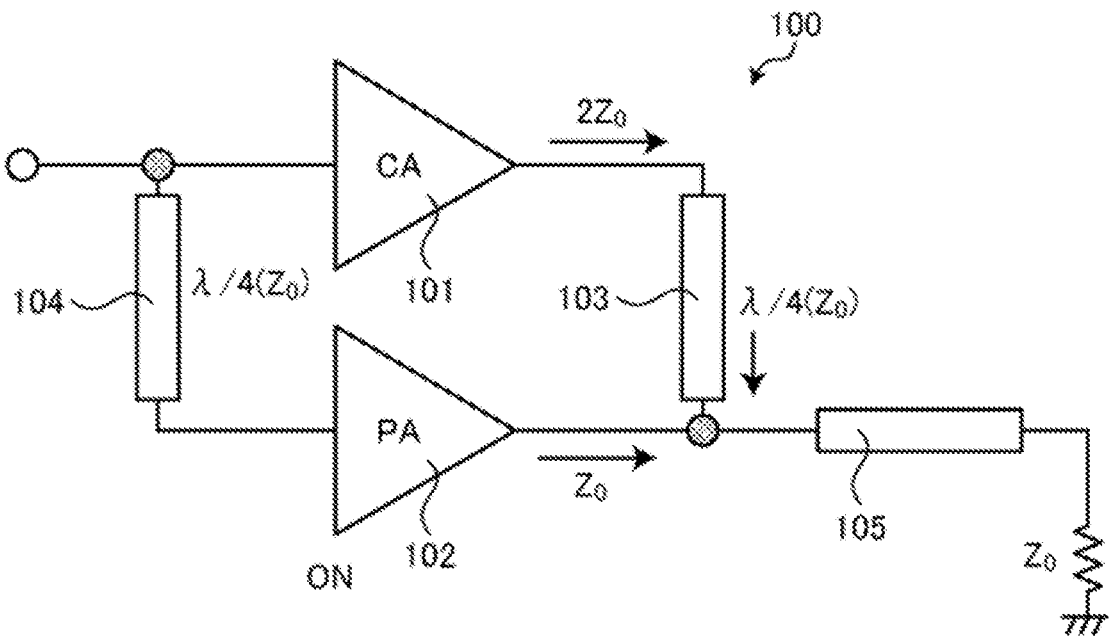
FIG. 28C is an explanatory diagram illustrating an example of an operation of the Doherty amplifier in a case where input power is the predetermined value or more.
Figure 29:
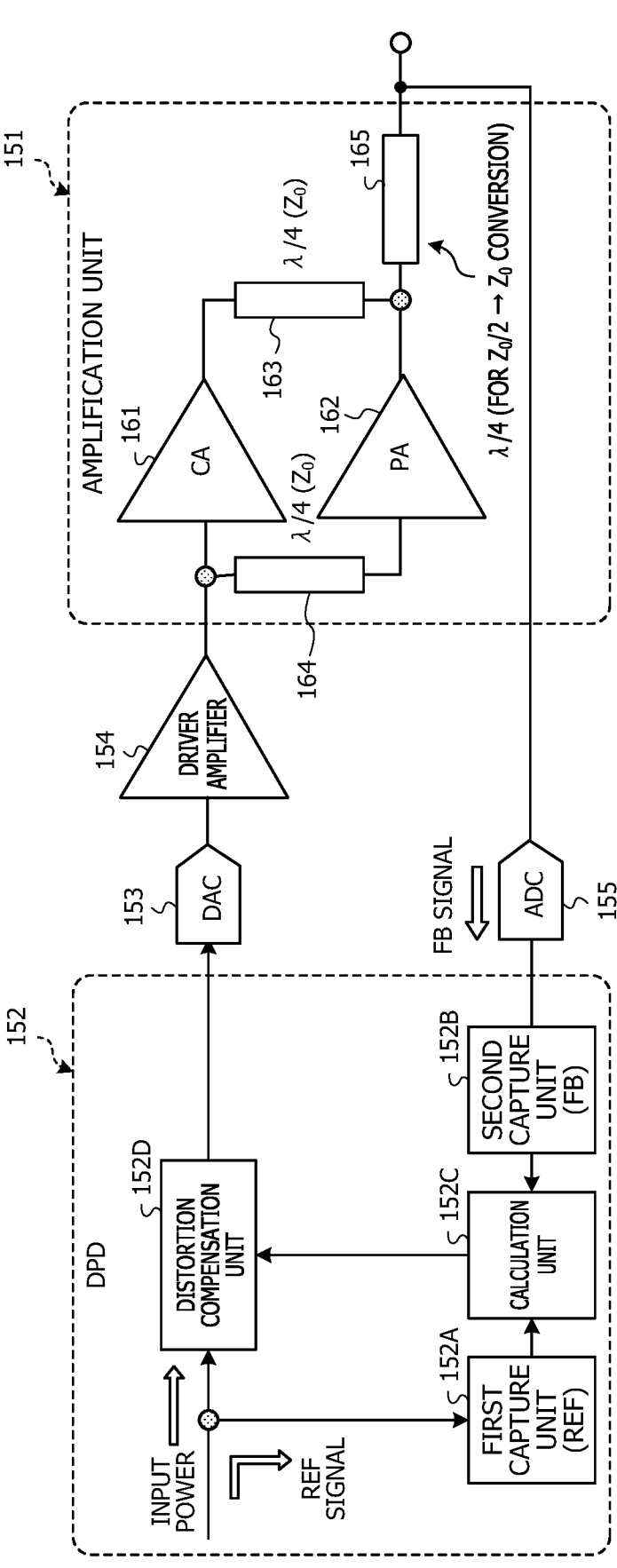
FIG. 29 is an explanatory diagram illustrating an example of an existing Doherty amplification device.

FIG. 27 is an explanatory diagram illustrating an example of a hardware configuration of a base station 60 that is an example of application of the Doherty amplification device 1. The base station 60 illustrated in FIG. 27 includes a communication interface 61, a wireless communication circuit 62, a storage device 63, and a processor 64. The communication interface 61 is an interface that is coupled to a host device and acquires information such as a transmission signal. The wireless communication circuit 62 incorporates the Doherty amplification device 1 that amplifies an RF signal. The storage device 63 stores various tables such as the phase table 44 and the delay table 45 in the Doherty amplification device 1. The processor 64 is the control unit 46 in the adjustment unit 26 in the Doherty amplification device 1.

Note that the adjustment unit 26 (26A or 26B) and the DPD 10 are implemented by, for example, a processor as hardware. Examples of the processor 64 include a central processing unit (CPU), a digital signal processor (DSP), a field programmable gate array (FPGA), and the like. Furthermore, the storage device 63 is implemented by, for example, a random access memory (RAM) such as a synchronous dynamic random access memory (SDRAM), a read only memory (ROM), or a flash memory, as hardware. Furthermore, the distribution unit 21, the first DAC 22A, the second DAC 23A, the first driver amplifier 22B, the second driver amplifiers 23B, the CA 22C, and the PA 23C, the combining unit 24, and the ADC 30 are implemented by, for example, an analog circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A Doherty amplification device comprising:
a distributor configured to distribute, into a first signal and a second signal, an input signal after distortion compensation from a distortion compensator that performs distortion compensation for the input signal;
a first amplifier configured to amplify the first signal;
a second amplifier configured to amplify the second signal;
a combiner configured to combine the first signal from the first amplifier and the second signal from the second amplifier; and
an adjuster arranged between the distributor and one of the first amplifier and the second amplifier and configured to include
a first calculation circuit configured to obtain a first characteristic that indicates a relationship of a gain of an output signal with respect to reference power of the input signal, based on the output signal output from the combiner and the input signal input to the distortion compensator,
a classification circuit configured to classify the obtained first characteristic into a plurality of regions according to a level of the reference power,
a second calculation circuit configured to obtain a statistical value of the gain for each of the classified regions, and
a determination circuit configured to set, in the adjuster, a phase delay value at which distortion to be generated in the output signal output from the combiner is minimized, based on the obtained statistical value for each of the regions,
wherein the adjuster adjusts the phase delay value of one of the first signal and the second signal from the distributor.

2. The Doherty amplification device according to claim 1, wherein the first calculation circuit, after a predetermined phase delay value is set in the adjuster in a state where distortion compensation is not applied in the distortion compensator, obtains the first characteristic based on the output signal output from the combiner and the input signal input to the distortion compensator.

3. The Doherty amplification device according to claim 2, wherein the first calculation circuit obtains an AM-AM (gain) characteristic as the first characteristic.

4. The Doherty amplification device according to claim 1, wherein
the adjuster includes
a phase adjuster configured to adjust a phase value of one of the first signal and the second signal, and
a delay adjuster coupled in series to the phase adjuster and configured to adjust a delay value of one of the first signal and the second signal,
wherein the classification circuit classifies the obtained first characteristic into a Low region, a High region higher in level than the Low region, and a Peak region higher in level than the High region according to the level of the reference power in the first characteristic, and wherein the determination circuit sets a set phase value at which a gain average value that is a statistical value in the Peak region becomes largest in the phase adjuster, and sets a set delay value at which a gain average value that is a statistical value in one of the High region and the Peak region becomes largest in the delay adjuster.

5. The Doherty amplification device according to claim 4, wherein the determination circuit sets the phase delay value in the adjuster so that distortion to be generated in the output signal output from the combiner is minimized by reducing a decrease of the gain in the Peak region and reducing variations of gains in the High region and the Low region.

6. The Doherty amplification device according to claim 1, wherein the first calculation circuit, after a predetermined phase delay value is set in the adjuster in a state where distortion compensation is not applied in the distortion compensator at a predetermined timing before product shipment of the Doherty amplification device, obtains the characteristic based on the output signal output from the combiner and the input signal input to the distortion compensator.

7. The Doherty amplification device according to claim 4, wherein the adjuster further includes an amplitude adjuster that is coupled in series to one of the phase adjuster and the delay adjuster and adjusts an amplitude pattern of one of the first signal and the second signal.

8. The Doherty amplification device according to claim 4, wherein the adjuster further includes an amplitude adjuster that is coupled in series to one of the phase adjuster and the delay adjuster and adjusts an amplitude frequency correction pattern of one of the first signal and the second signal.

\* \* \* \* \*